(12) United States Patent
Loubet et al.

(10) Patent No.: US 12,040,373 B2
(45) Date of Patent: Jul. 16, 2024

(54) LINER-FREE RESISTANCE CONTACTS AND SILICIDE WITH SILICIDE STOP LAYER

(71) Applicant: International Business Machines Corporation, Armonk, NY (US)

(72) Inventors: Nicolas Loubet, Guilderland, NY (US); Christian Lavoie, Pleasantville, NY (US); Adra Carr, Albany, NY (US); Nicholas Anthony Lanzillo, Wynantskill, NY (US)

(73) Assignee: International Business Machines Corporation, Armonk, NY (US)

( * ) Notice: Subject to any disclaimer, the term of this patent is extended or adjusted under 35 U.S.C. 154(b) by 225 days.

(21) Appl. No.: 17/551,428

(22) Filed: Dec. 15, 2021

(65) Prior Publication Data
US 2023/0187521 A1 Jun. 15, 2023

(51) Int. Cl.
*H01L 29/45* (2006.01)
*H01L 29/40* (2006.01)
*H01L 29/78* (2006.01)

(52) U.S. Cl.
CPC .......... *H01L 29/456* (2013.01); *H01L 29/401* (2013.01); *H01L 29/7851* (2013.01)

(58) Field of Classification Search
CPC . H01L 29/456; H01L 29/401; H01L 29/7851; H01L 21/28518; H01L 29/0673; H01L 29/165; H01L 29/41725; H01L 29/775; H01L 29/7848; H01L 29/66545; H01L 29/66795; H01L 29/785; H01L 29/41791; B82Y 10/00
See application file for complete search history.

(56) References Cited

U.S. PATENT DOCUMENTS

| | | | |
|---|---|---|---|
| 7,692,254 B2 | 4/2010 | Anderson et al. | |
| 7,737,015 B2 | 6/2010 | Kohli et al. | |
| 8,435,893 B1* | 5/2013 | Nian | H01L 29/78 438/682 |
| 11,062,956 B2 | 7/2021 | Adusumilli et al. | |
| 2012/0241963 A1* | 9/2012 | Uozumi | H01L 21/76814 257/769 |
| 2014/0361375 A1* | 12/2014 | Deniz | H01L 29/517 257/369 |
| 2021/0035806 A1* | 2/2021 | Lee | H01L 29/0847 |
| 2022/0020855 A1* | 1/2022 | Liao | H01L 29/516 |

* cited by examiner

*Primary Examiner* — Shahed Ahmed
*Assistant Examiner* — Khatib A Rahman
(74) *Attorney, Agent, or Firm* — Cantor Colburn LLP; L. Jeffrey Kelly

(57) ABSTRACT

A semiconductor device includes a substrate including designated source or drain (source/drain) regions. An active source/drain is in the designated source/drain regions, and a source/drain cap liner is on an upper surface of the active source/drain. The semiconductor device further includes trench silicide regions completely filed with a silicide material.

12 Claims, 20 Drawing Sheets

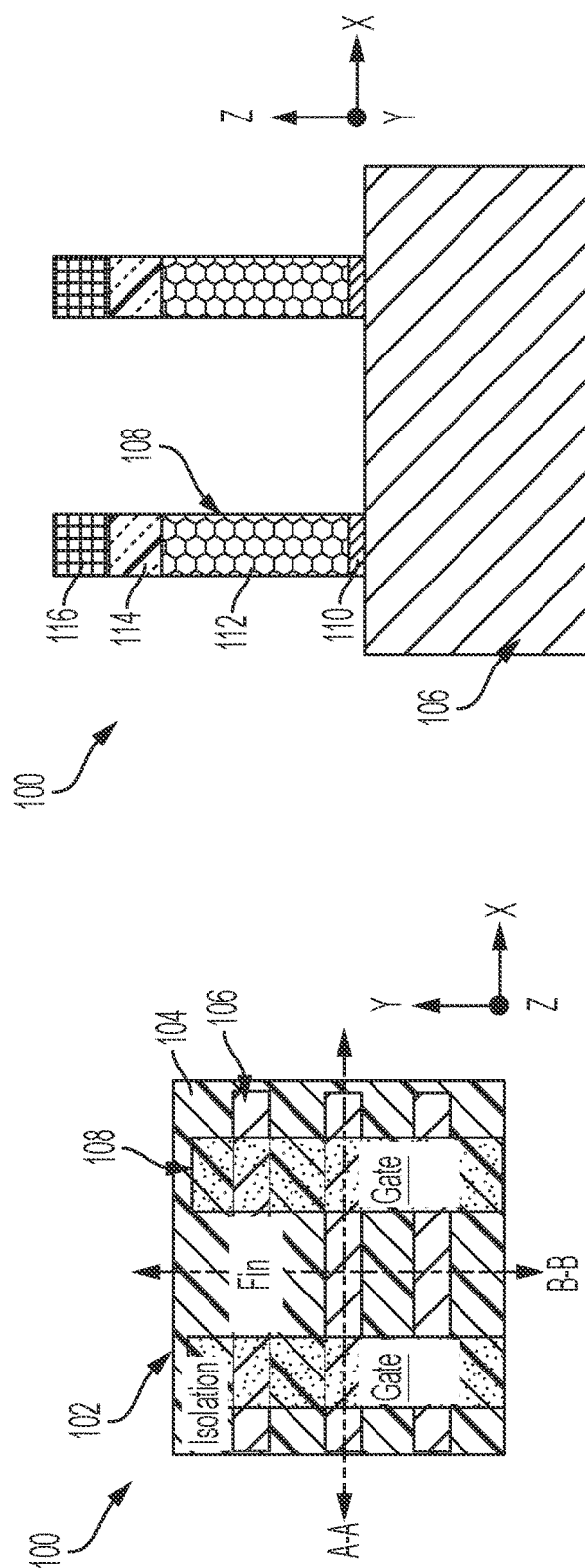

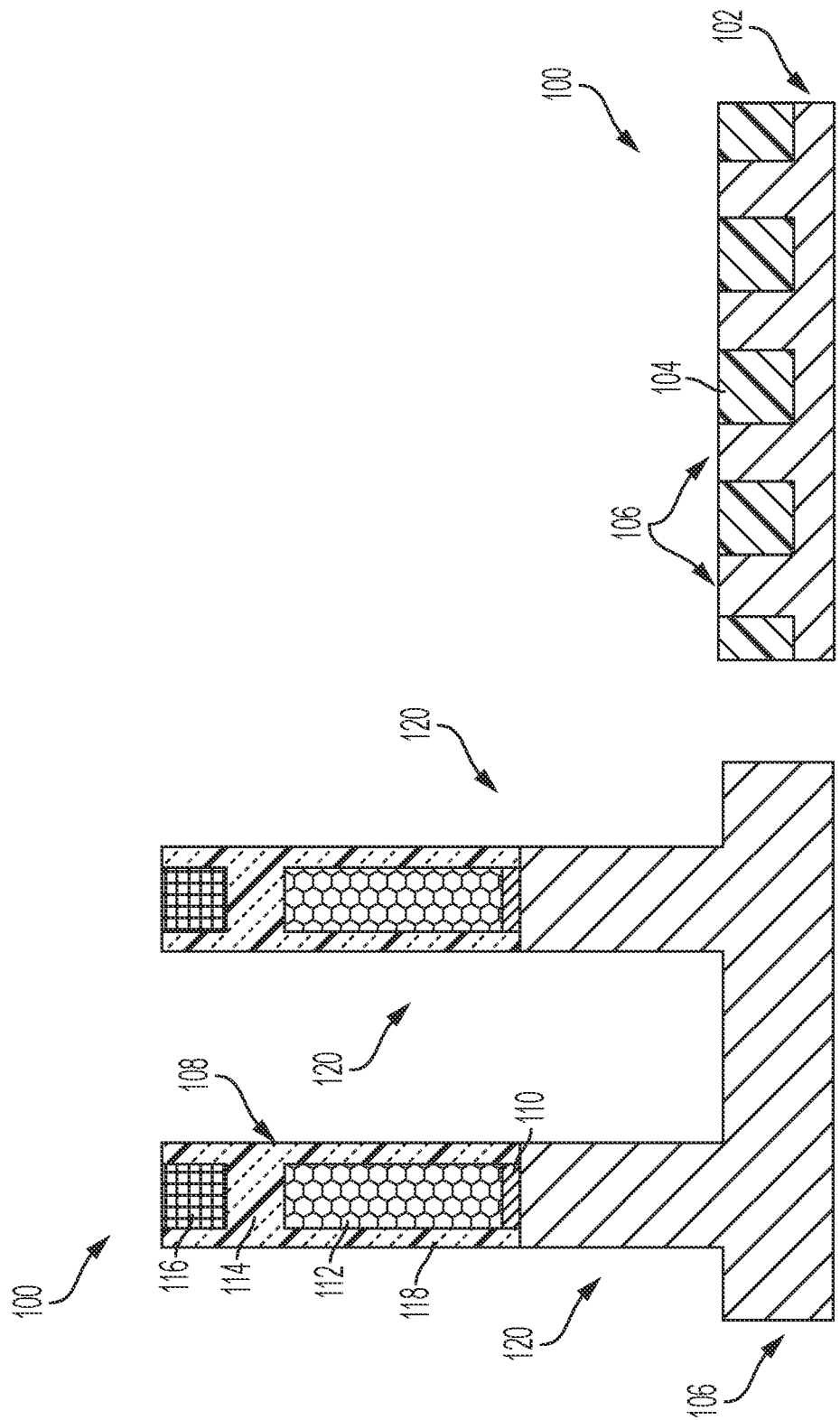

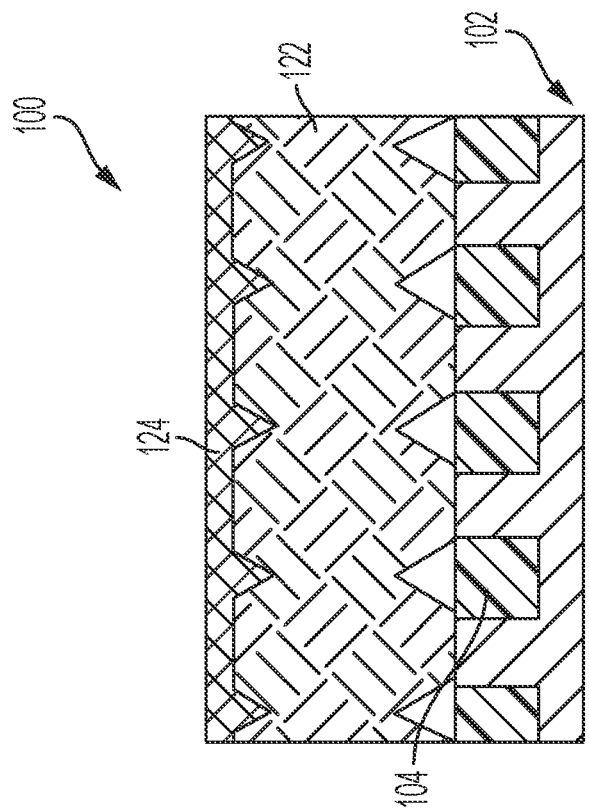
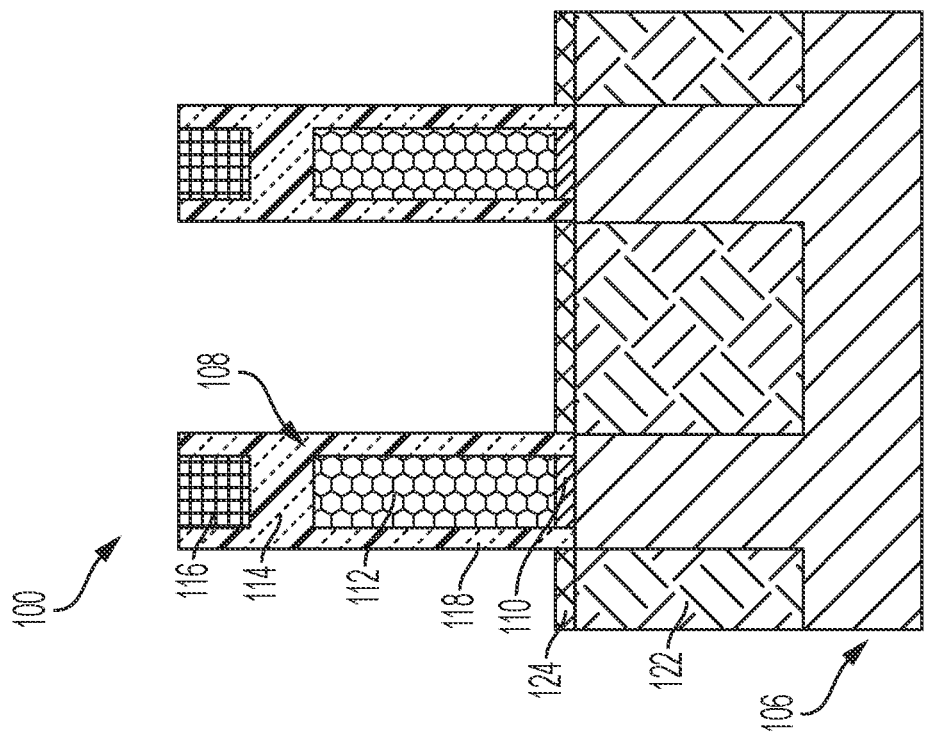
FIG. 3B
FIG. 3A

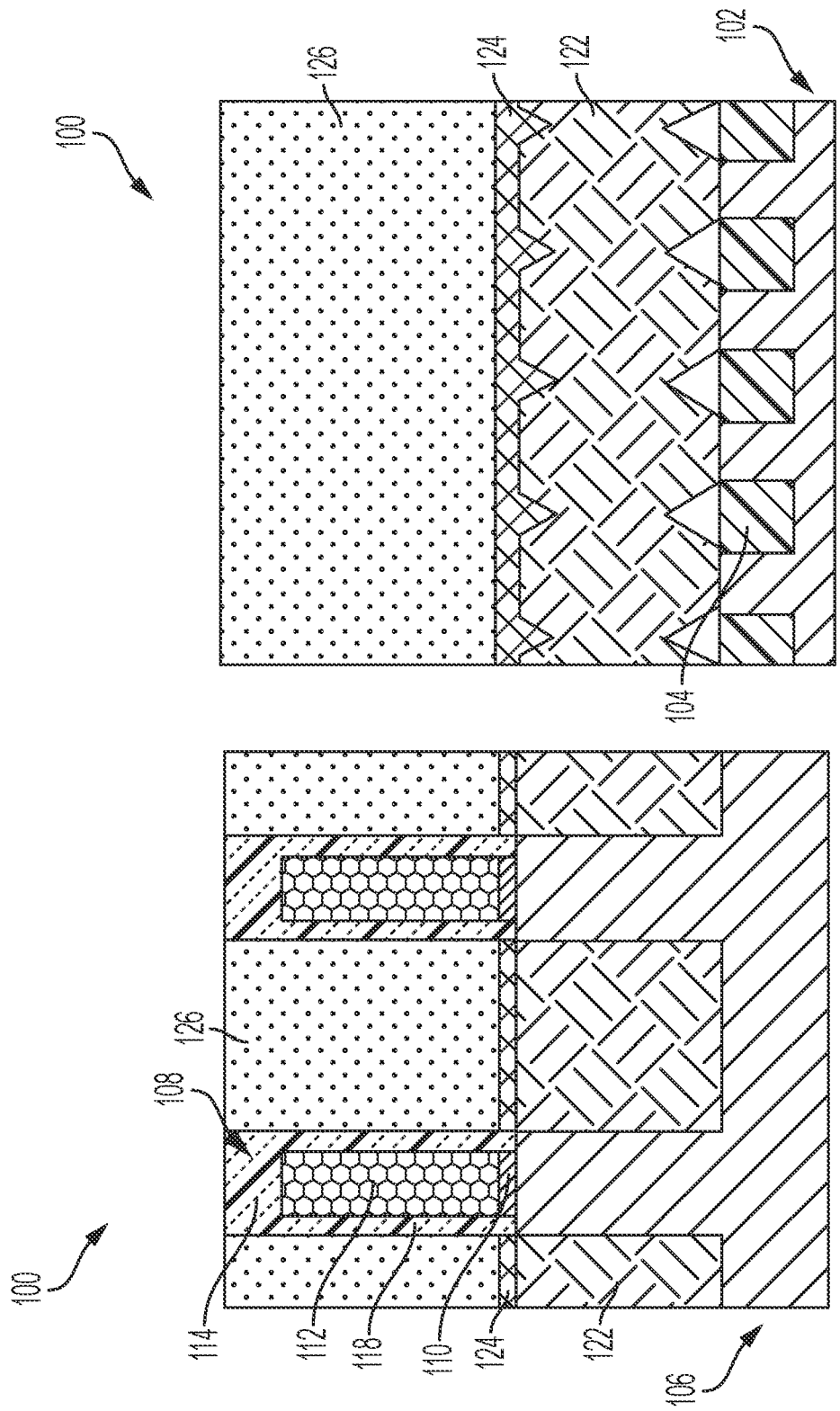

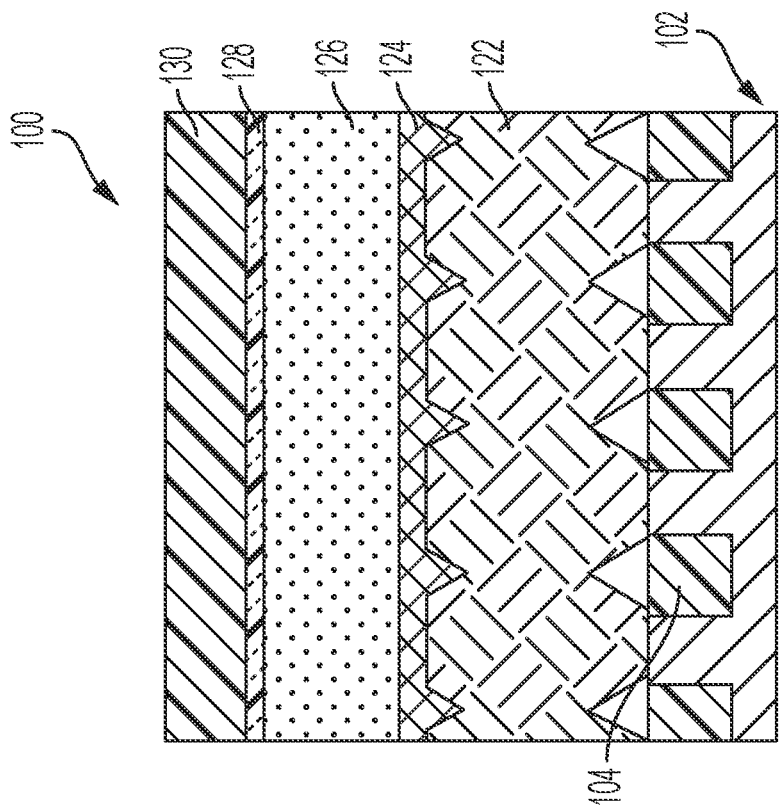
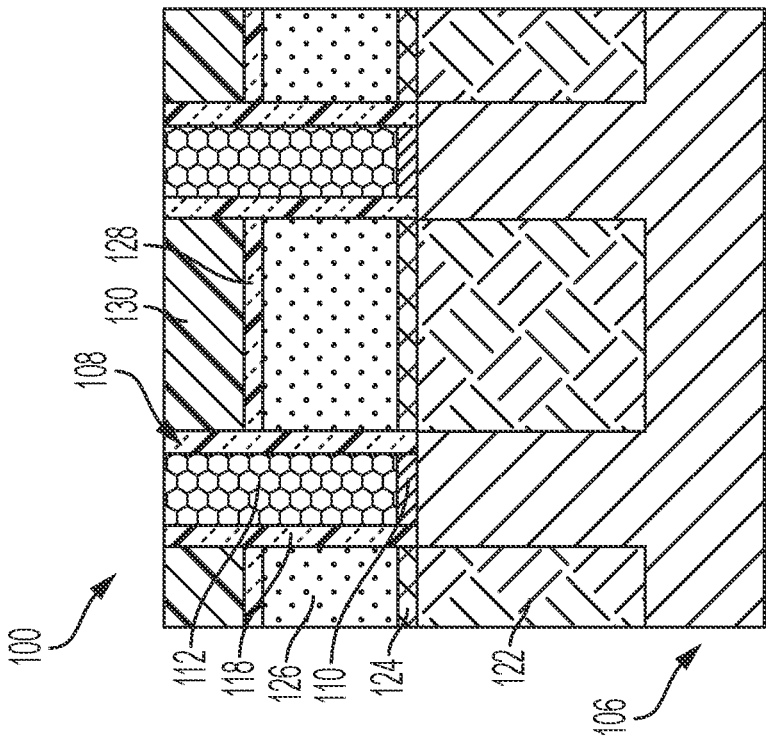
FIG. 5A
FIG. 5B

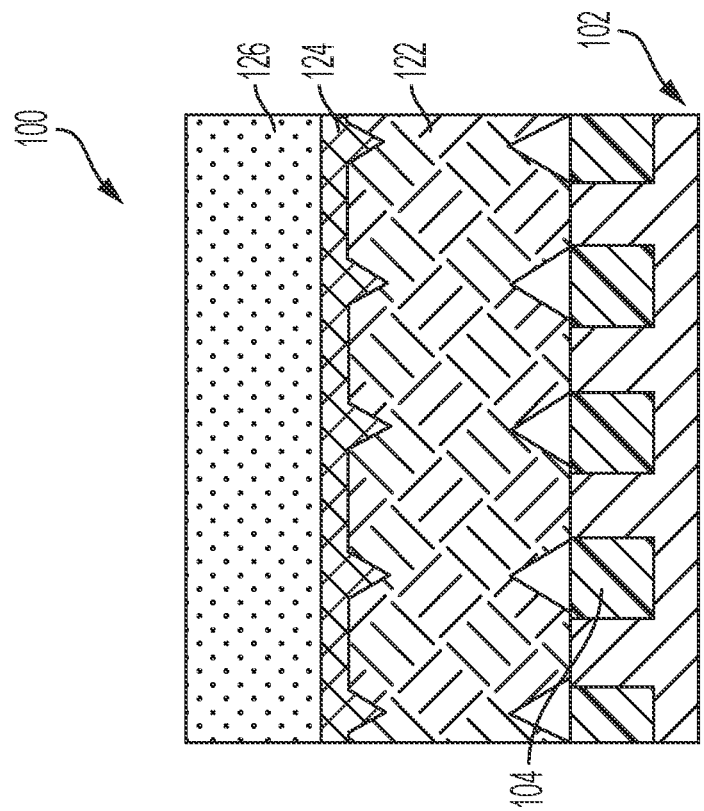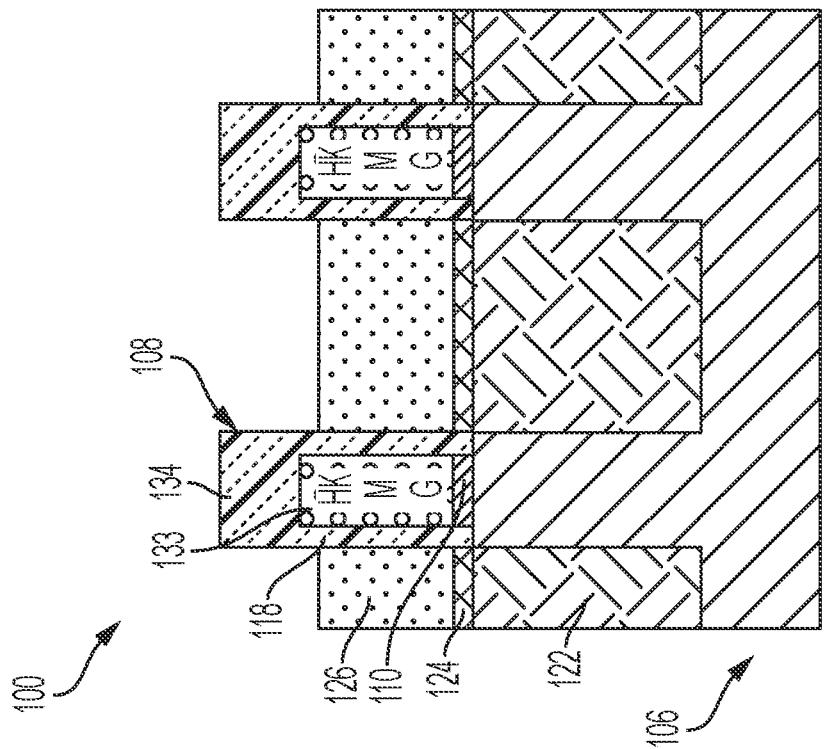
FIG. 8A
FIG. 8B

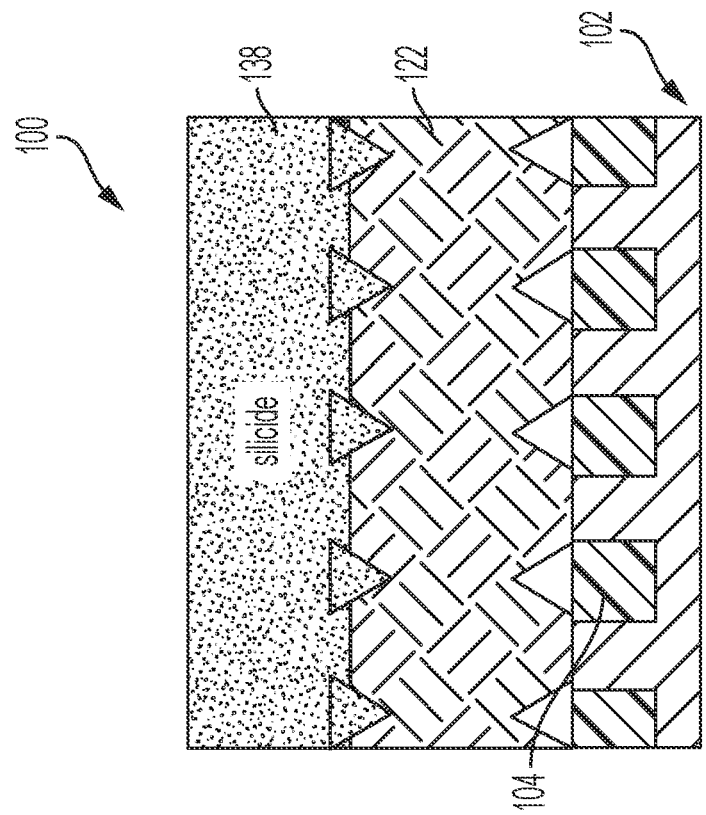
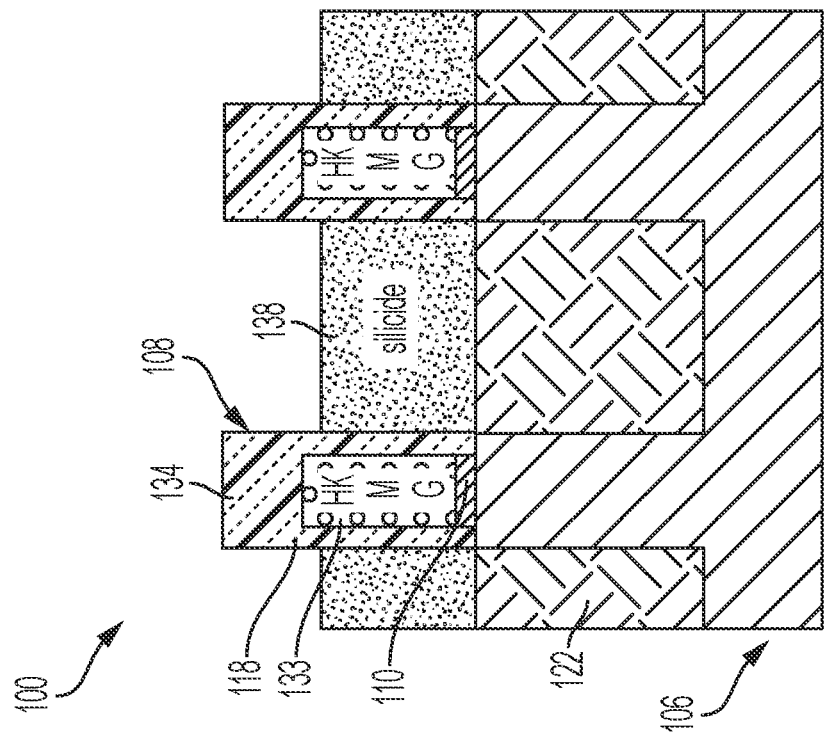
FIG. 10A
FIG. 10B

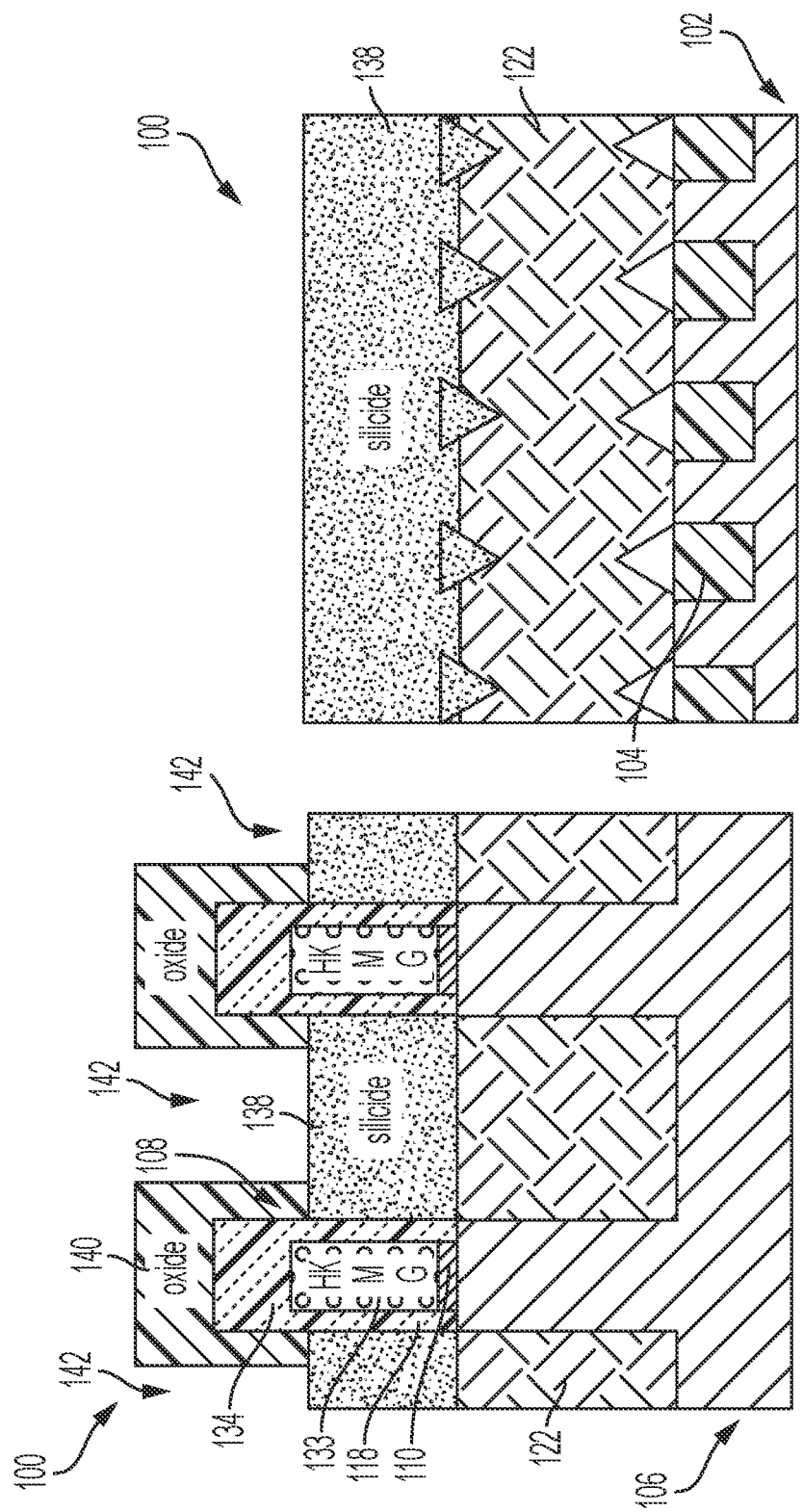

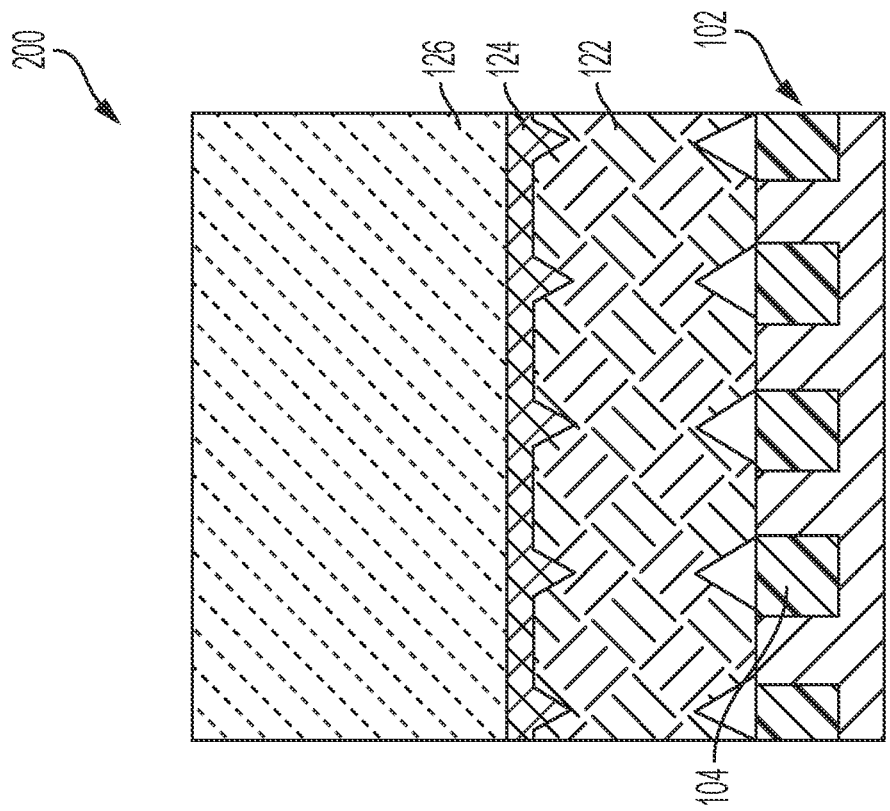
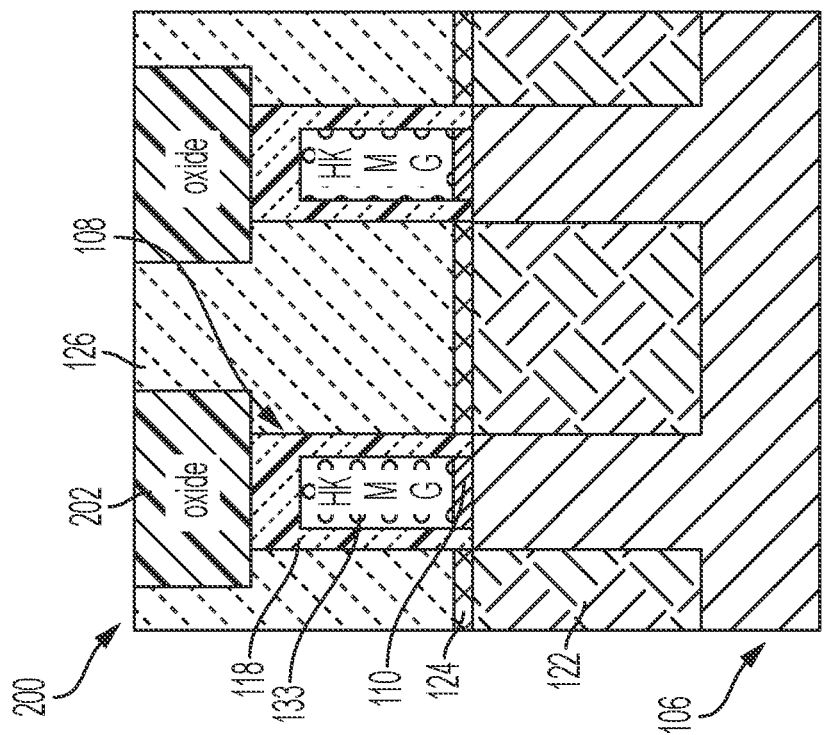
FIG. 14A
FIG. 14B

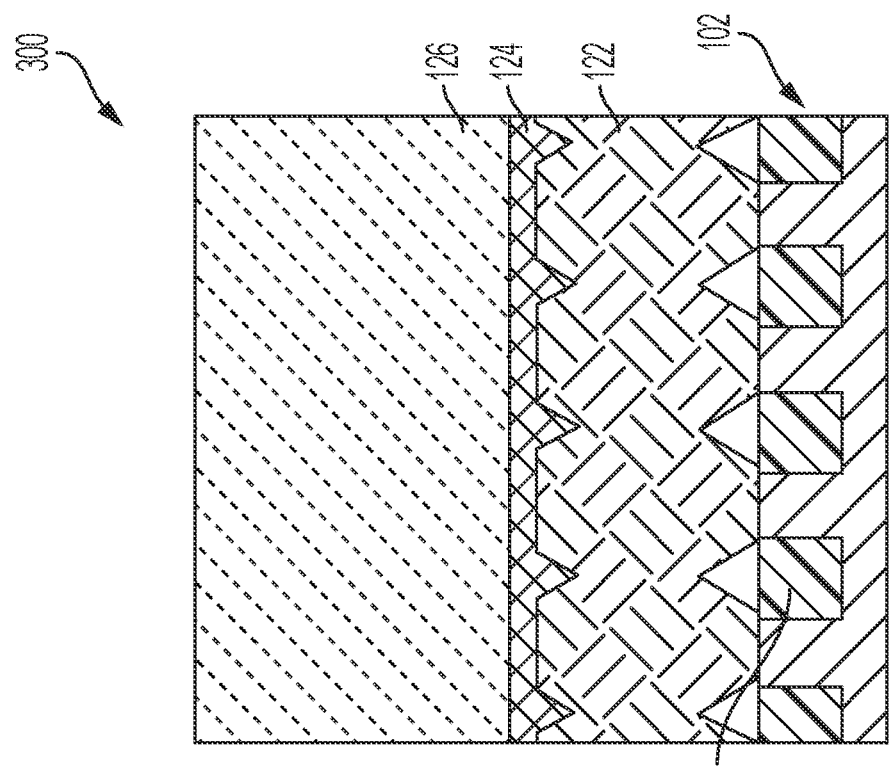
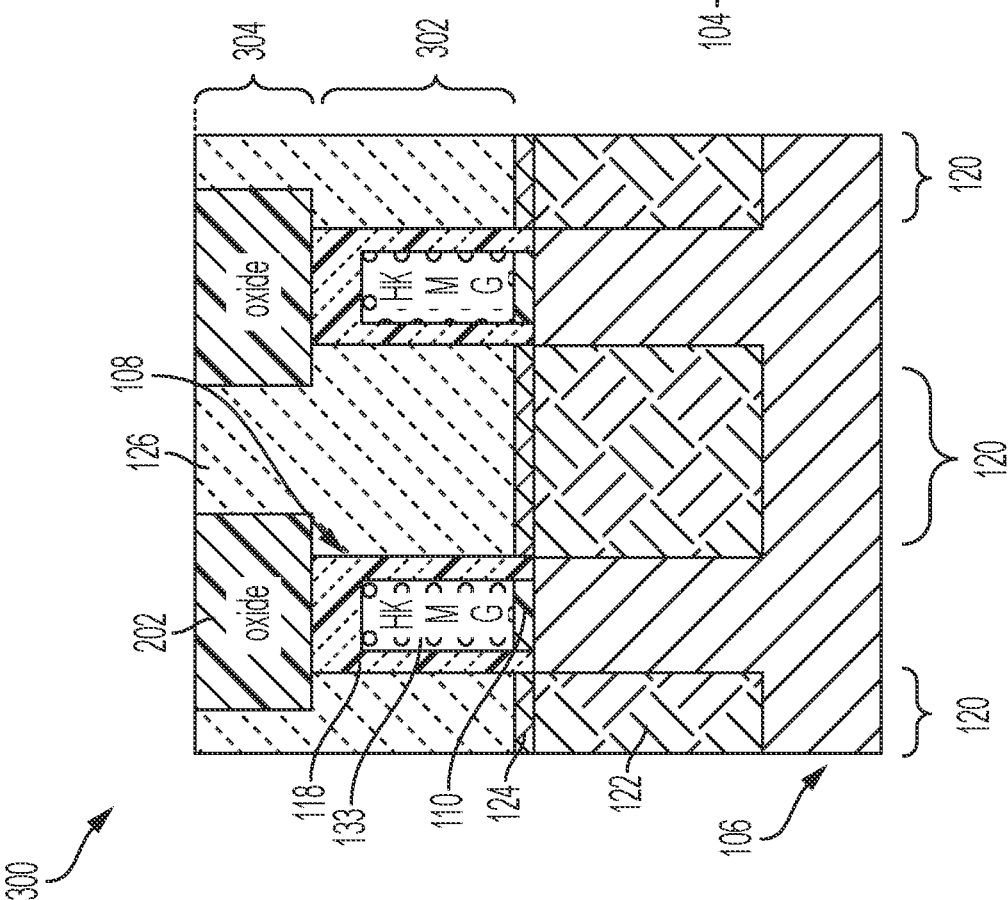
FIG. 16A
FIG. 16B

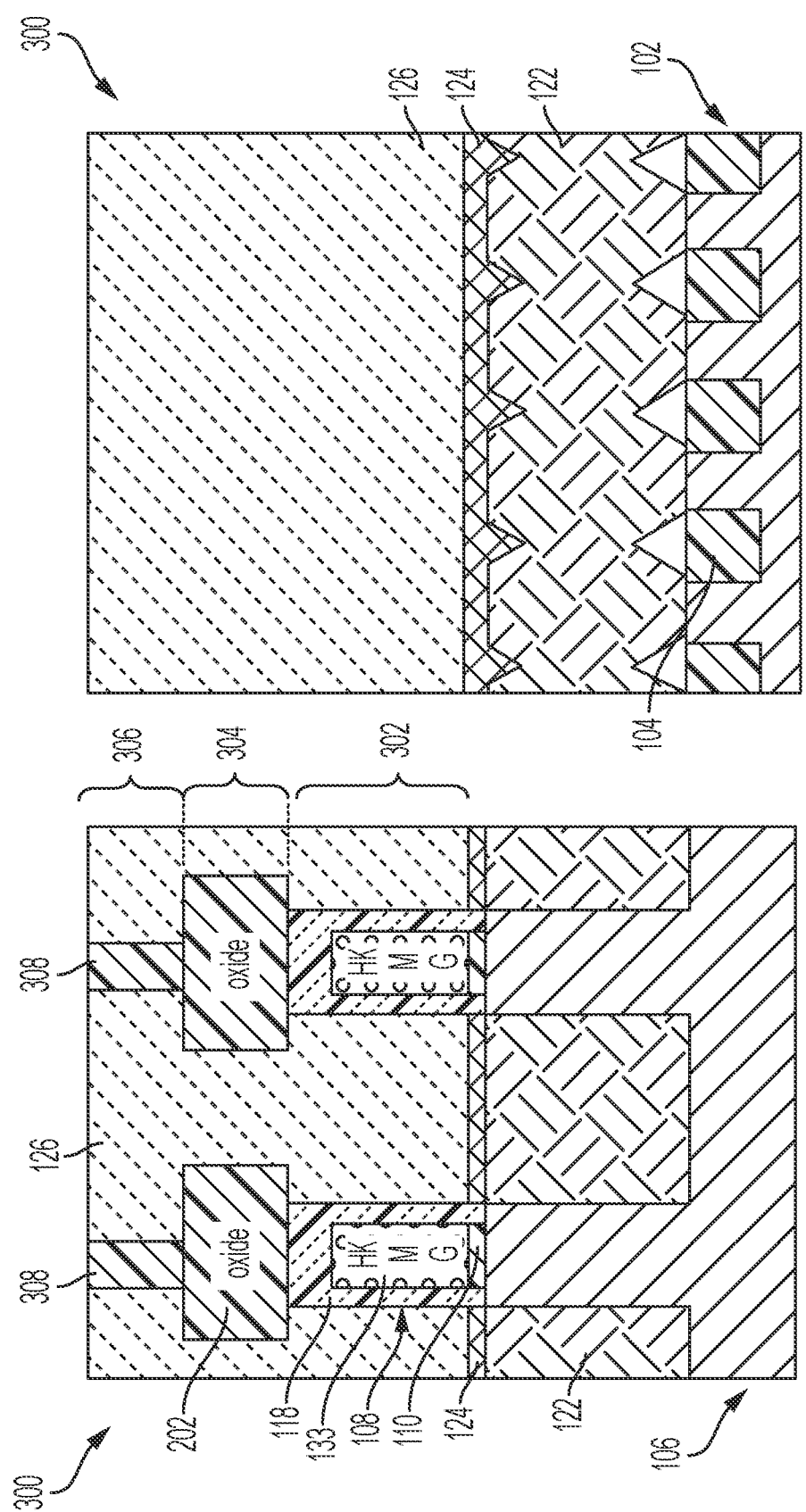

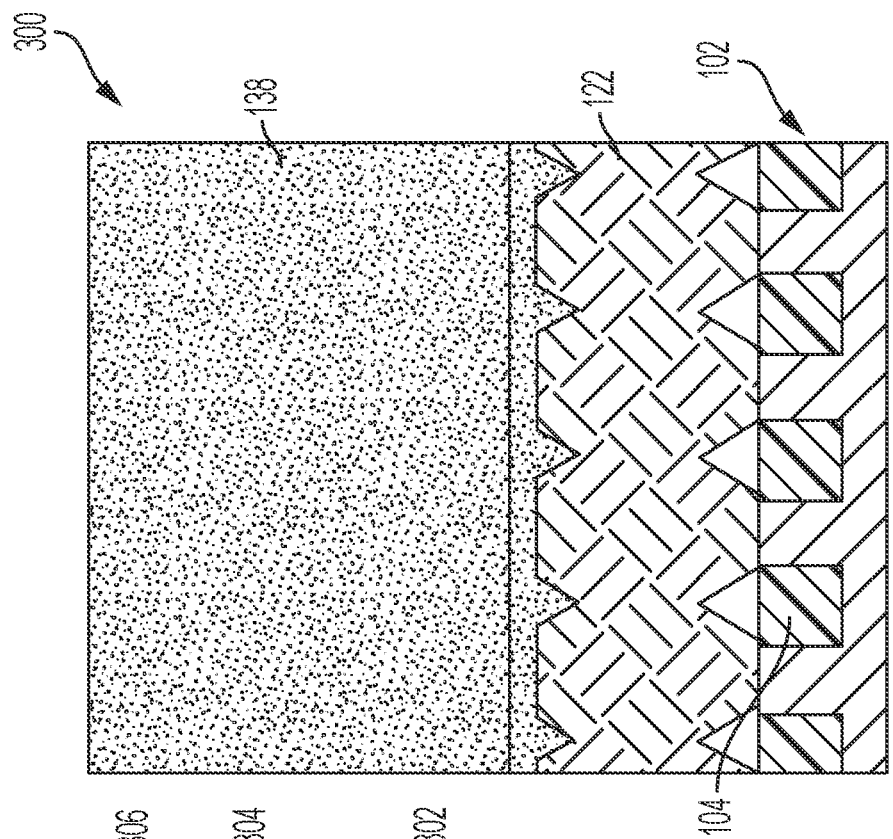
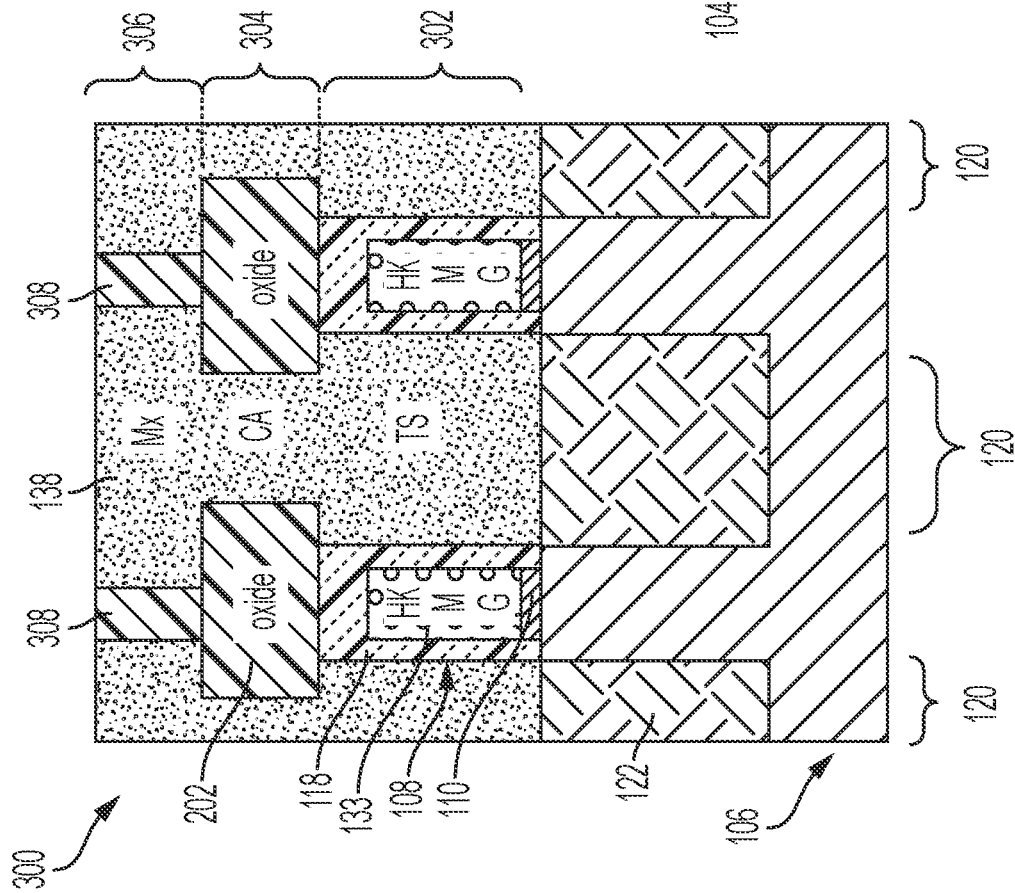
FIG. 18A
FIG. 18B

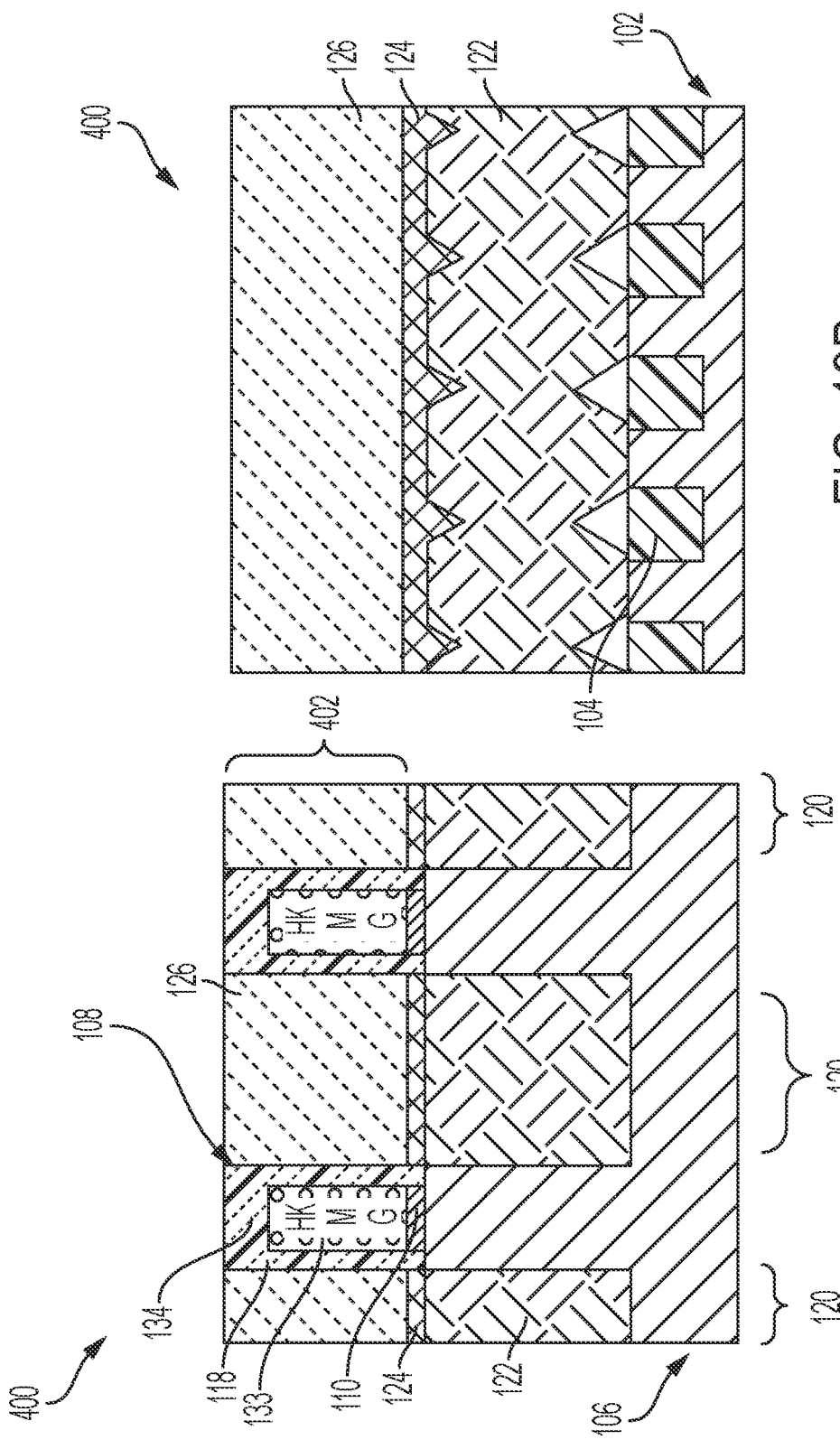

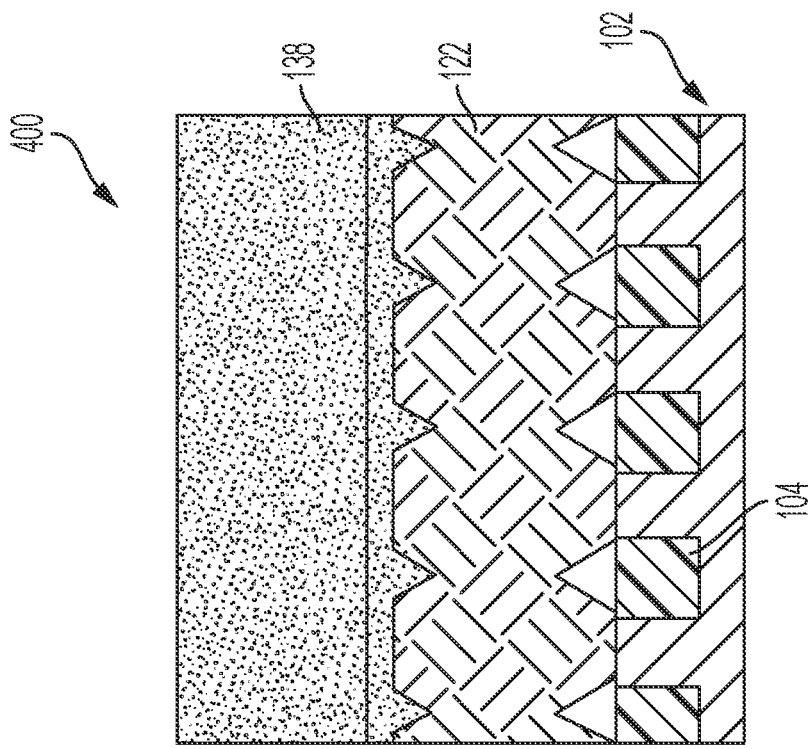
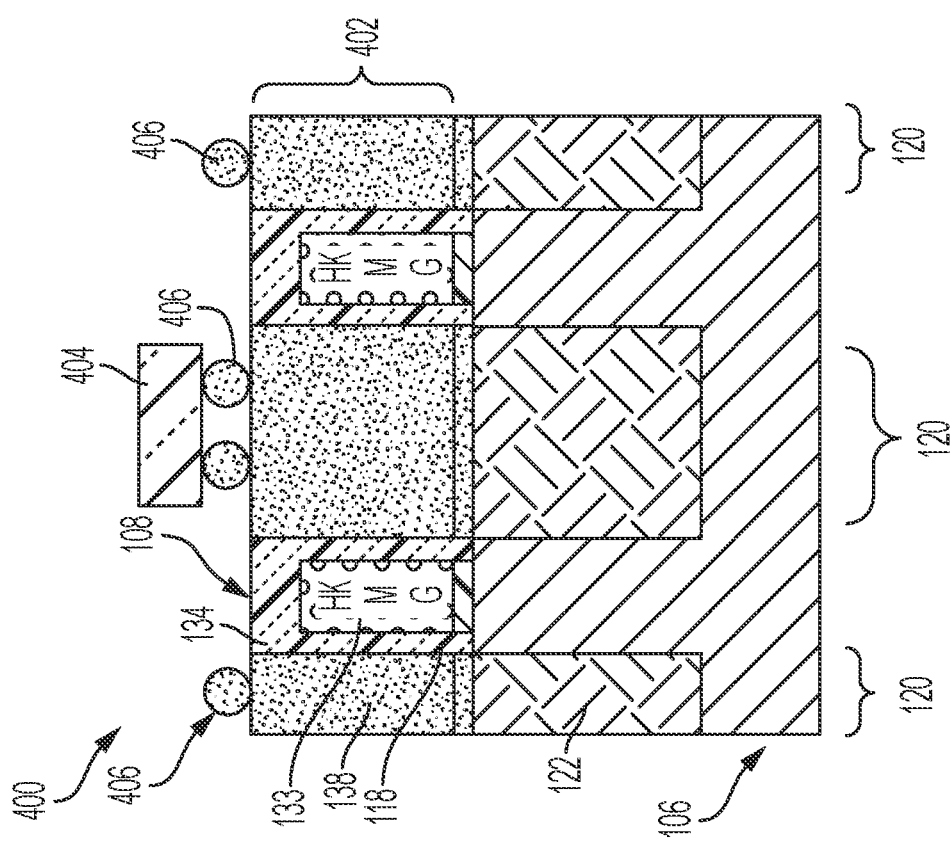
FIG. 20A
FIG. 20B

LINER-FREE RESISTANCE CONTACTS AND SILICIDE WITH SILICIDE STOP LAYER

BACKGROUND

The present invention relates to semiconductor devices, and more specifically, to transistors including liner-free resistance contacts and silicide with a silicide stop layer.

Three-dimensional (3D) transistors (also referred to as non-planar transistors) such as fin-type field effect transistor (finFETs) or nanosheet transistors, for example, have become a common design techniques used to fabricate semiconductor integrated circuits (ICs). A 3D transistor typically includes a gate electrode that is wrapped around a raised channel. The raised channel is typically achieved by forming a "fin" or stack of nanosheets on a semiconductor substrate. Contacts are formed on the transistor to establish electrical conductivity to the source, drain, and gate.

SUMMARY

According to a non-limiting embodiment, a semiconductor device comprises a substrate including designated source or drain (source/drain) regions. An active source/drain is in the designated source/drain regions, and a source/drain cap liner is on an upper surface of the active source/drain. The semiconductor device further includes trench silicide regions completely filed with a silicide material.

According to another non-limiting embodiment of the invention, a method of fabricating a semiconductor device comprises forming an active source or drain (source/drain) in respective designated source/drain regions of the semiconductor device, and depositing a source/drain cap liner on an upper surface of the active source/drains. The method further comprises depositing a silicide precursor material on an upper surface of the source/drain cap liner, and converting the silicide precursor material into a silicide material.

Additional technical features and benefits are realized through the techniques of the present invention. Embodiments and aspects of the invention are described in detail herein and are considered a part of the claimed subject matter. For a better understanding, refer to the detailed description and to the drawings

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A-12B are a series of views illustrating a method of fabricating a semiconductor device according to non-limiting embodiments of the present invention, in which:

FIG. 1A is a top-down view of an intermediate semiconductor device including a plurality of gate structures formed on a plurality of channels according to a non-limiting embodiment of the present invention;

FIG. 1B is a cross sectional view of the intermediate semiconductor device shown in FIG. 1A depicted in a first orientation taken along line A-A;

FIG. 1C is a cross sectional view of the intermediate semiconductor device shown in FIG. 1B depicted in a second orientation taken along line B-B;

FIG. 2A is a cross-sectional view of the semiconductor device depicted in the first orientation after forming gate spacers on a gate structure according to non-limiting embodiments of the present invention;

FIG. 2B is a cross-sectional view of the semiconductor device shown in FIG. 2A depicted in the second orientation;

FIG. 3A is a cross-sectional view of the semiconductor device depicted in the first orientation following the formation of active source/drains according to non-limiting embodiments of the present invention;

FIG. 3B is a cross-sectional view of the semiconductor device shown in FIG. 3A depicted in the second orientation;

FIG. 4A is a cross-sectional view of the semiconductor device depicted in the first orientation following deposition of a silicide buffer material according to non-limiting embodiments of the present invention;

FIG. 4B is a cross-sectional view of the semiconductor device shown in FIG. 4A depicted in the second orientation;

FIG. 5A is a cross-sectional view of the semiconductor device depicted in the first orientation after depositing a hardmask liner on an upper surface of the silicide buffer and depositing an oxide layer on the hardmask liner according to non-limiting embodiments of the present invention;

FIG. 5B is a cross-sectional view of the semiconductor device shown in FIG. 5A depicted in the second orientation;

FIG. 8A is a cross-sectional view of the semiconductor device depicted in the first orientation after etching away the oxide layer and the hardmask liner according to non-limiting embodiments of the present invention;

FIG. 8B is a cross-sectional view of the semiconductor device shown in FIG. 8A depicted in the second orientation;

FIG. 10A is a cross-sectional view of the semiconductor device depicted in the first orientation after performing a temperature anneal to covert the silicide precursor material into silicide to form a trench silicide (TS) structure according to non-limiting embodiments of the present invention;

FIG. 10B is a cross-sectional view of the semiconductor device shown in FIG. 10A depicted in the second orientation;

FIG. 11A is a cross-sectional view of the semiconductor device depicted in the first orientation after patterning an interlayer dielectric material deposited on the silicide to define contact trenches according to non-limiting embodiments of the present invention;

FIG. 11B is a cross-sectional view of the semiconductor device shown in FIG. 11A depicted in the second orientation;

FIG. 12B is a cross-sectional view of the semiconductor device shown in FIG. 12A depicted in the second orientation.

FIGS. 13A-15B are a series of views illustrating a method of fabricating a semiconductor device according to non-limiting embodiments of the present invention, in which:

FIG. 13A is a cross-sectional view of the semiconductor device depicted in the first orientation after covering the gate structures with an interlayer dielectric material according to non-limiting embodiments of the present invention;

FIG. 13B is a cross-sectional view of the semiconductor device shown in FIG. 13A depicted in the second orientation;

FIG. 14A is a cross-sectional view of the semiconductor device depicted in the first orientation after depositing a silicide precursor material to cover the interlayer dielectric material according to non-limiting embodiments of the present invention;

FIG. 14B is a cross-sectional of the semiconductor device shown in FIG. 14A depicted in the second orientation;

FIG. 15B is a cross-sectional of the semiconductor device shown in FIG. 15A depicted in the second orientation.

FIGS. 16A-18B are a series of views illustrating a method of fabricating a semiconductor device according to non-limiting embodiments of the present invention, in which:

FIG. 16A is a cross-sectional view of the semiconductor device depicted in the first orientation following deposition of a silicide precursor material to cover an interlayer dielectric material formed on the gate structures according to non-limiting embodiments of the present invention;

FIG. 16B is a cross-sectional of the semiconductor device shown in FIG. 16A depicted in the second orientation;

FIG. 17A is a cross-sectional view of the semiconductor device depicted in the first orientation after forming via structures on an upper surface of the interlayer dielectric material and surrounding the via structures with additional silicide precursor material according to non-limiting embodiments of the present invention;

FIG. 17B is a cross-sectional of the semiconductor device shown in FIG. 17A depicted in the second orientation;

FIG. 18A is a cross-sectional view of the semiconductor device depicted in the first orientation after converting the silicide precursor material into silicide according to non-limiting embodiments of the present invention; and FIG. 18B is a cross-sectional of the semiconductor device shown in FIG. 18A depicted in the second orientation.

FIGS. 19A-20B are a series of views illustrating a method of fabricating a semiconductor device according to non-limiting embodiments of the present invention, in which:

FIG. 19A depicts the semiconductor device in the first orientation after depositing a silicide precursor material in a middle of the line (MOL) region according to non-limiting embodiments of the present invention;

FIG. 19B is a cross-sectional of the semiconductor device shown in FIG. 19A depicted in the second orientation;

FIG. 20A depicts the semiconductor device in the first orientation after converting the silicide precursor material into silicide so that the MOL is filled entirely with the silicide according to non-limiting embodiments of the present invention; and FIG. 20B is a cross-sectional of the semiconductor device shown in FIG. 20A depicted in the second orientation.

DETAILED DESCRIPTION

Figure 6B:
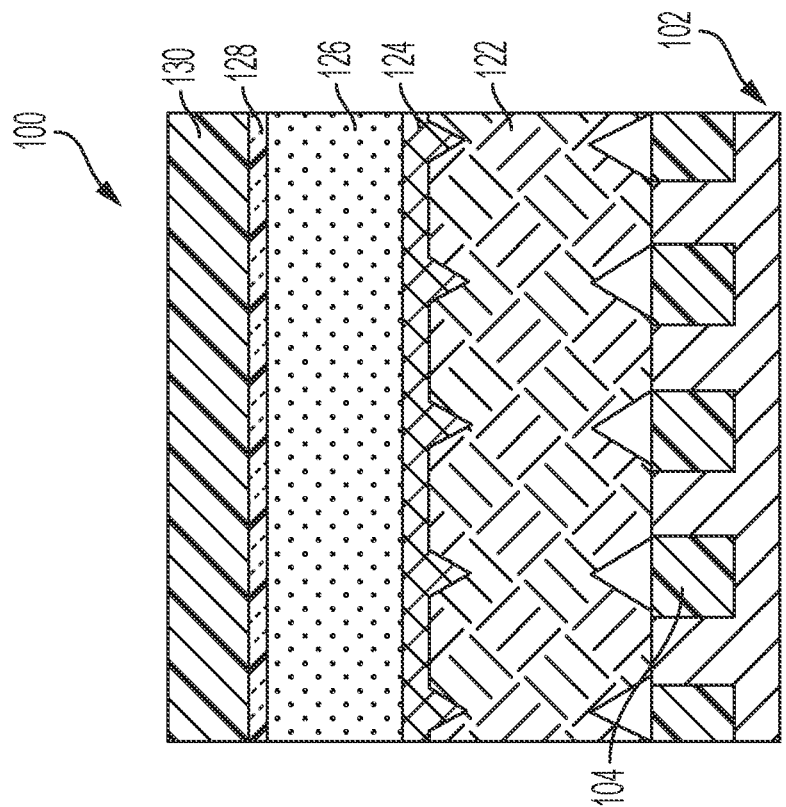
FIG. 6B is a cross-sectional view of the semiconductor device shown in FIG. 6A depicted in the second orientation.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of the technologies that are more specifically relevant to aspects of the present invention, a complementary metal-oxide-semiconductor (CMOS), is a type of semiconductor device that uses complementary and symmetrical pairs of p-type and n-type transistors, such a p-type and n-type metal-oxide-semiconductor field effect transistors (MOSFETs). The channel region connects the source and the drain, and electrical current flows through the channel region from the source to the drain. The electrical current flow is induced in the channel region by a voltage applied at the gate electrode. CMOS technology is often used to construct integrated circuit (IC) chips, including microprocessors, microcontrollers, memory chips and other digital logic circuits. CMOS technology can also be used to design and construct various analog circuits such as image sensors, data converters, RF circuits and highly integrated transceivers for many types of communication.

Metal contacts formed on the source, drain, and gate can be used to connect one or more of the transistors to other components of the semiconductor IC. To ensure that the IC is reliable and has desired performance characteristics, it is important to reduce the electrical resistance of the contacts. Conventional metal deposition techniques typically employ low-resistive, highly-diffusive metals such as cobalt (Co), copper (Cu), nickel (Ni), platinum (Pt) or gold (Au), for example, to establish metal contacts in the source or drain (source/drain) regions. A thin contact liner made of a barrier metal such as titanium nitride (TiN) or tantalum nitride (TaN), for example, is then formed on a silicide material to limit electron diffusion from the metal contacts into the active source-drains of the transistor. However, the barrier metal contact liner increases the resistance of the source/drain regions while also inhibiting the ability to form wrap-around contacts for the source/drain regions.

Various non-limiting embodiments of the present invention provide a 3D transistor that includes liner-free resistance contacts in combination with silicide that reduces electrical resistance in the source/drain regions. In the 3D transistor, the silicide precursor material used to form the silicide serves as a diffusion buffer layer. A source/drain cap further protects the active source/drains by slowing down the silicide formation at the cap interface and effectively causing the silicide to self-limit. The converted silicide is capable inhibiting electron diffusion from a large amount of low-resistive, high-diffusion metals that can serve as source/drain contacts, while also serving as a shunt (i.e., creating a low electrical resistance path) between the source/drain contacts and the active source/drain.

With reference now to FIGS. 1A-12B, a series of views illustrate a method of fabricating a semiconductor device according to non-limiting embodiments of the present disclosure. In this non-limiting embodiment of the invention, a silicide precursor material is used to form a trench silicide (TS) structure of a wrap-around source/drain contact structure, while the silicide precursor material also serves as a buffer layer that protects the underlying active source/drains when converting the silicide precursor material into silicide.

FIGS. 1A, 1B and 1C depict an intermediate semiconductor device 100 following various intermediate processing operations of a fabrication process flow. In the present specification and claims, an "intermediate" semiconductor device is defined as a semiconductor device in a stage of fabrication prior to a final stage or prior to fabricated a completed device. The semiconductor device 100 includes a substrate 102 extending along a first axis (e.g., an X-axis) to define a length, a second axis (e.g., a Y-axis) orthogonal to the first axis to define a width, and a third axis (e.g., a Z-axis) orthogonal to the first and second axes to define a height. In some non-limiting embodiments of the present invention, the substrate 102 can be formed from a semiconductor material such as, for example, silicon (Si), and can include one or more isolation regions 104 (sometimes referred to as shallow trench isolation (STI) regions) formed from various insulative or dielectric materials including, but not limited to, silicon dioxide ($SiO_2$). In some embodiments of the present invention, the substrate 102 can be formed as a silicon on insulator (SOI) substrate, which includes an insulator layer (e.g., a layer of $SiO_2$) on a silicon substrate.

At this stage of the process flow, the semiconductor device 100 includes a plurality of channels 106 formed on the substrate 102 and a plurality of gate structures 108 formed on the channels 106. According to one or more non-limiting embodiments of the invention, the channels 106 are formed as raised channels 106 (see FIG. 1C). The raised channels 106 are arranged along the Y-axis and are separated from one another by a respective isolation region 104. In some non-limiting embodiments of the invention, the raised channels 106 can each be formed as an individual fin formed from a semiconductor material (e.g., silicon). In some non-limiting embodiments the invention, the raised channels 106 can each be formed as individual stacks of nanosheets formed from a semiconductor material (e.g., silicon).

Each gate structure 108 wraps around at least the sidewalls and the upper surface of each raised channel 106 to facilitate fabrication of a 3D transistor (see FIG. 1B). The gate structures 108 each include a gate insulating layer 110, a sacrificial gate 112, a hardmask layer 114, and a gate masking layer 116.

The gate insulating layer 110 can be formed from various insulative materials such as, for example, $SiO_2$, or a high-k material, and is formed on the upper surface of a respective channel 106. The sacrificial gate 112 is formed on the gate insulating layer 110 and can be formed from a polysilicon conductor material (often referred to as "poly-si"). The hardmask layer 114 is formed on an upper surface of sacrificial gate 112, and can be formed from a nitride material including, but not limited to, silicon nitride (SiN). The gate masking layer 116 is formed on an upper surface of the sacrificial gate 112, and can be formed from an oxide material including, but not limited to, $SiO_2$.

The sacrificial gate insulating layer 110, the sacrificial gate 112, the hardmask layer 114, and the gate masking layer 116 can all be formed by various deposition techniques including, but not limited to, physical vapor deposition (PVD), chemical vapor deposition and spin-on deposition. In one or more non-limiting embodiments of the invention, poly-si used to form the sacrificial gates 112. The gate masking layer 116 can be patterned to define a targeted profile of the gate structures 108. An etching process such as a reactive ion etch (RIE) process can then be performed to form the sacrificial gates 108 and the gate insulating layers 110.

Turning now to FIGS. 2A and 2B, the semiconductor device 100 is illustrated after forming gate spacers 118 on the gate structure 108 and recessing a portion of the raised channels 106 to define designated source/drain regions 120. The gate spacers 118 can be formed, for example, by depositing a conformal layer of nitride material (e.g., SiN) on the sidewalls of the sacrificial gates 112 and the upper surface of the gate masking layer 116. An etching process, e.g., a RIE process, can then be performed to expose the upper surface of the gate masking layer 116 to form the spacers 1720. In one or more non-limiting embodiments of the invention, the RIE process can also remove a portion of the gate spacer material from the upper surface of the raised channel regions 106.

Still referring to FIGS. 2A and 2B, a portion of the raised channels 106 can be etched to recess a portion of the raised channels 106 not covered by the gate structures 108 to define the designated source/drain regions 120. In one or more non-limiting embodiments of the invention, a portion of the raised channels 106 can be recessed to a point at which the upper surface of the recessed channel 106 is co-planar (e.g. "flush") with the upper surface of the isolation regions 104 (see FIG. 2B).

Referring now to FIGS. 3A and 3B, the semiconductor device 100 is depicted after forming source/drains 122 in the designated source/drain regions 120. The formation of the source/drains 122 can be performed, for example, by epitaxially growing a semiconductor material such as silicon, for example, from an upper surface of the raised channels 106.

In one or more non-limiting embodiments of the invention, the source/drains 122 can be formed by growing epitaxial layers from gaseous or liquid precursors. For example, an epitaxial silicon material can be grown from the upper surface of the raised channel 106 using vapor-phase epitaxy (VPE), molecular-beam epitaxy (MBE), liquid-phase epitaxy (LPE), or other suitable process. The epitaxial material can include, but is not limited to, silicon (Si), silicon germanium (SiGe), and/or carbon doped silicon (Si:C). In one or more non-limiting embodiments of the invention, the epitaxial silicon material can be doped by adding a dopant or impurity to form a desired type of transistor. For example, the epitaxial silicon can be doped with n-type dopants (e.g., phosphorus or arsenic) to form an n-type transistor (e.g., an nFET) or a p-type dopants (e.g., boron or gallium) to form a p-type transistor (e.g., a pFET).

The epitaxial layers forming the source/drains 122 can be grown using a suitable growth process including, but not limited, CVD, liquid phase (LP), reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

In one or more non-limiting embodiments of the invention, a source/drain cap 124 can be formed on the upper surface of the source/drains 122. The source/drain cap 124 can be formed by epitaxially growing a layer of silicon germanium (SiGe) from exposed upper surfaces of the source/drains 122. The source/drain cap 124 is capable of serving as a silicide stop layer and reducing the formation of silicide at the cap interface (i.e., the interface between the underlying source/drains 122 and silicide (not shown in FIGS. 3A-3B) subsequently formed on the upper surface of the source/drain cap 124. In this manner, the underlying source/drains 122 can be protected when forming silicide above the source/drains 122 as described in greater detail below.

Referring to FIGS. 4A and 4B, the semiconductor device 100 is illustrated following deposition of a silicide precursor material 126 according to non-limiting embodiments of the present invention. The silicide precursor material 126 can serve as a "buffer" when performing a subsequent silicidation using highly diffusive metals as described in greater detail below.

The silicide precursor material 126 can be any suitable material capable of being converted into silicide. In one or more non-limiting embodiments of the invention, the silicide precursor material 126 includes, but is not limited to, poly-si and amorphous silicon (a-si). The silicide precursor material 126 can be deposited using various techniques including, but not limited to, CVD, plasma-enhanced chemical vapor deposition (PECVD), solid-phase crystallization, and laser crystallization. The silicide precursor material 126 can have a thickness that is suitable to support the silicidation process with highly diffusive metals. For example, the silicide precursor material 126 can have a thickness of about 10 nanometers or greater, for example, which would facilitate formation of silicide in the channel 106 without forming silicide too deep into the source drain. In one or more non-limiting embodiments of the invention, the silicide precursor material 126 is deposited to completely encapsulate the gate structures 108, and is recessed using a CMP process, for example, that stops on the upper surface of the hardmask layer 114. Accordingly, the upper surface of the silicide precursor material 126 is co-planar (i.e., flush) with the upper surface of the hardmask layer 114.

Turning to FIGS. 5A and 5B, the semiconductor device 100 is illustrated after recessing the silicide precursor material 126 below the hardmask layer 114 and depositing a hardmask liner 128 and an oxide layer 130. The hardmask liner 128 and oxide layer 130 serve to protect the underlying precursor material 126 when performing replacement metal gate process as described in greater detail below.

The hardmask liner 128 can be deposited on the silicide precursor material 126 using, for example, PVD, CVD, etc. The oxide layer 130 (e.g., TS oxide) can be deposited on the upper surface of the hardmask liner 128 using, for example, PVD, CVD, etc. The hardmask liner 128 can be SiN, for example. The oxide layer 130 can be, for example, flowable chemical vapor deposition (FCVD) oxide material or a high-density oxide material. After the oxide layer 130 is deposited, a CMP process can be performed until an upper surface of the sacrificial gate 112 is exposed.

Figure 6A:
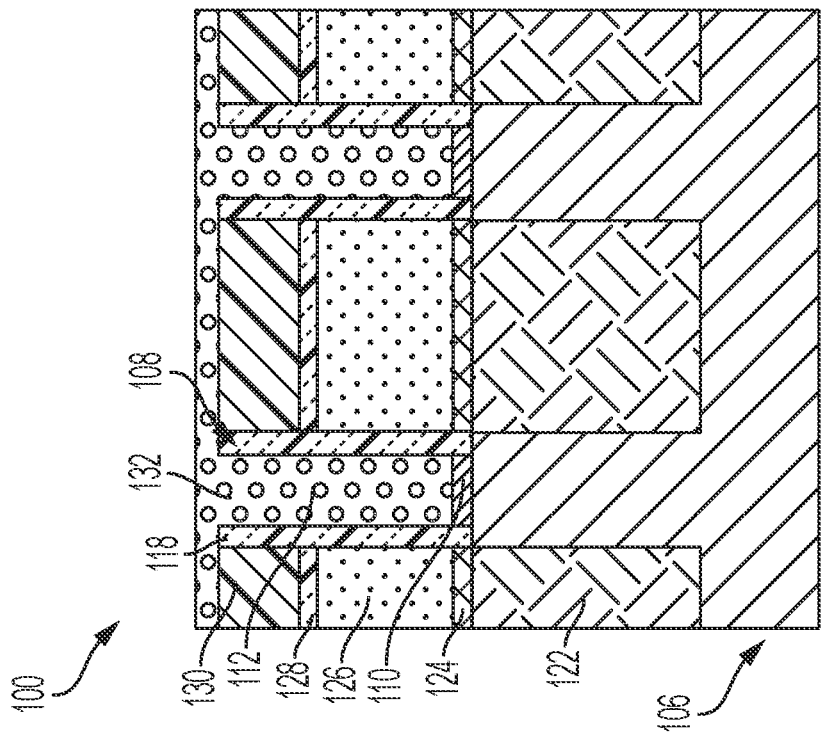
FIG. 6A is a cross-sectional view of the semiconductor device depicted in the first orientation after replacing the sacrificial gate material with a metal gate material according to non-limiting embodiments of the present invention.

Turning to FIGS. 6A and 6B, the semiconductor device 100 is illustrated after replacing the sacrificial gate 112 with a metal gate material 132. In one or more non-limiting embodiments, the sacrificial gate 112 can be removed by etching the material of the sacrificial gate 112 selective to the hardmask liner 128 and the oxide layer 130 to form gate trenches. The gates trenches can then be re-filled with the metal gate material 132. The metal gate material 132 can be deposited by a suitable deposition process, for example, ALD, CVD, PECVD, PVD, plating, thermal or e-beam evaporation, and sputtering. In one or more non-limiting embodiments, the metal gate material 132 is deposited to overfill the gate trench formed after removing the sacrificial gate 112. The metal gate material 132 can be various suitable conductive metals including, but not limited to, aluminum (Al), titanium (Ti), Tantalum (Ta), Nitrogen (N), Lanthanum (La), tungsten (W), or any combination thereof.

In one or more non-limiting embodiments, both the sacrificial gate 112 and gate dielectric 110 can be removed, and replaced with a high-k oxide liner, one or more workfunction metal liners, and the metal gate material 132. For example, gate trenches formed after removing the sacrificial gate 112 can be lined by conformally depositing one or more high-k dielectric materials. The high-k dielectric material(s) can be a dielectric material having a dielectric constant greater than 4.0, 7.0, or 10.0 (e.g., $HfO_2$). Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The high-k dielectric material layer may be formed by suitable deposition processes, for example, ALD, CVD, PECVD, ALD, PVD, chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm After depositing the high-k liner, one or more workfunction metals are conformally deposited on the high-k dielectric material. The work function metal(s) may be disposed over the high-k dielectric material. Non-limiting examples of suitable work function metals include p-type work function metal materials and n-type work function metal materials. P-type work function materials include compositions such as ruthenium, palladium, platinum, cobalt, nickel, titanium, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. In some embodiments, the same metal is used in both high-k gate stacks (e.g., titanium). The metal gate material 132 can then be deposited to overfill the gate trench.

Figure 7A:
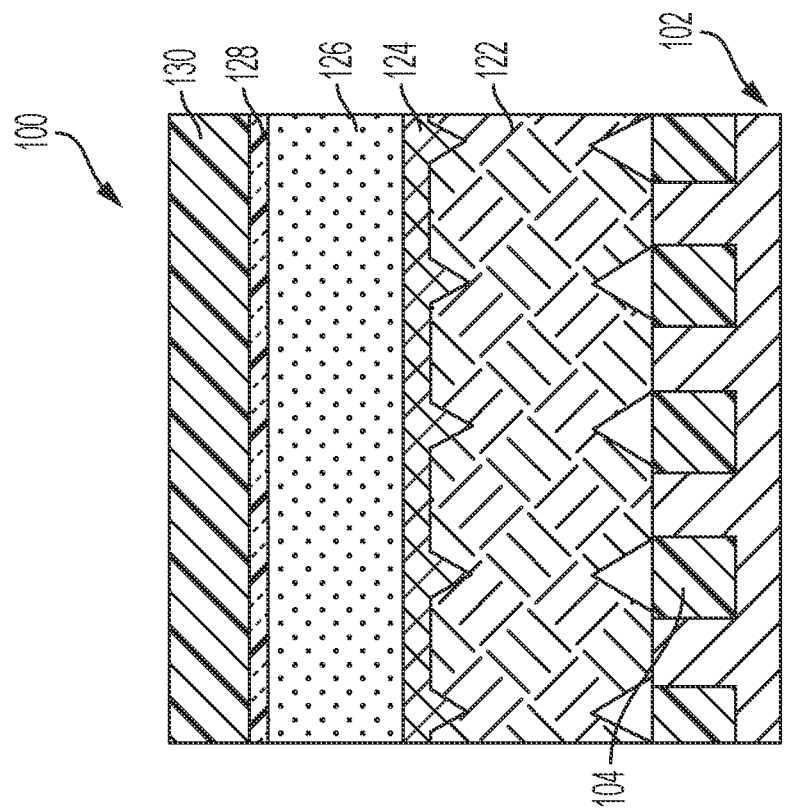
FIG. 7A is a cross-sectional view of the semiconductor device depicted in the first orientation after partially etching the metal gate material and depositing a gate cap according to non-limiting embodiments of the present invention.
Figure 7B:
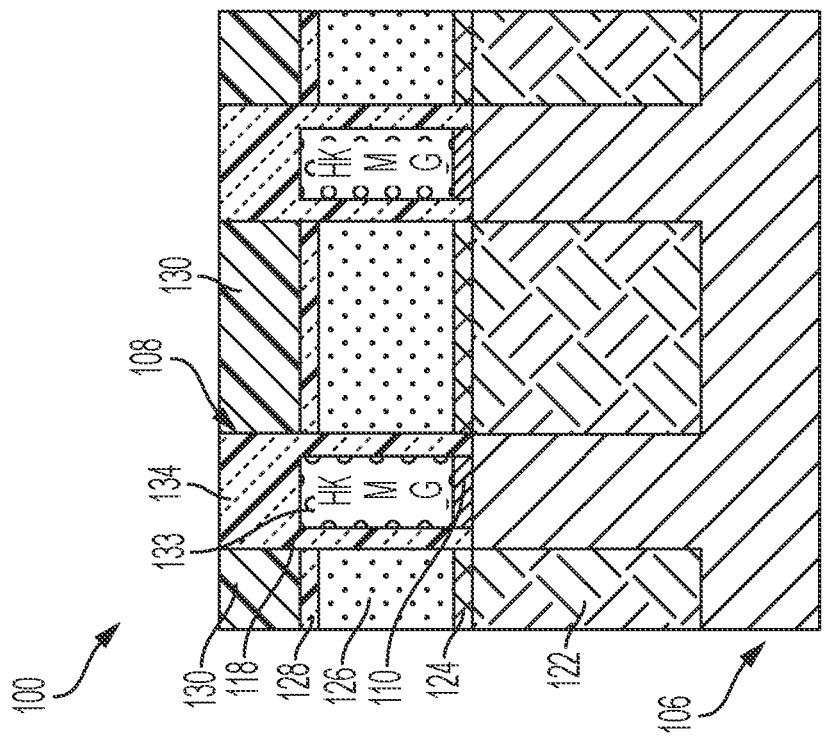
FIG. 7B is a cross-sectional view of the semiconductor device shown in FIG. 7A depicted in the second orientation.

Referring to FIGS. 7A and 7B, the semiconductor device 100 is depicted after partially etching the metal gate material and depositing a gate cap 134 to form a metal gate 133. In one or more non-limiting embodiments, a portion of the metal material 132 can be etched selective to the gate spacers 118 and the oxide layer 130 so that the metal gate material 132 is partially recessed below the upper surface of the gate spacers 118. A hardmaks material such as SiN, for example, can then deposited on the metal gate 133 to form the gate cap 134.

Turning to FIGS. 8A and 8B, the semiconductor device 100 is illustrated after removing the oxide layer 130 and the hardmask liner 128 to expose the underlying silicide precursor material 126. In one or more non-limiting embodiments of the invention, the oxide layer 130 is removed by performing an etching process (e.g., a RIE) that etches the oxide layer 130 selective to the gate cap until reaching the underlying hardmask layer 128. The hardmask liner 128 can then be removed by performing an etching process (e.g., a RIE) or wet hydrofluoric-based (HF-based) etching process until an upper surface of the silicide precursor material 126 is exposed.

Figure 9A:
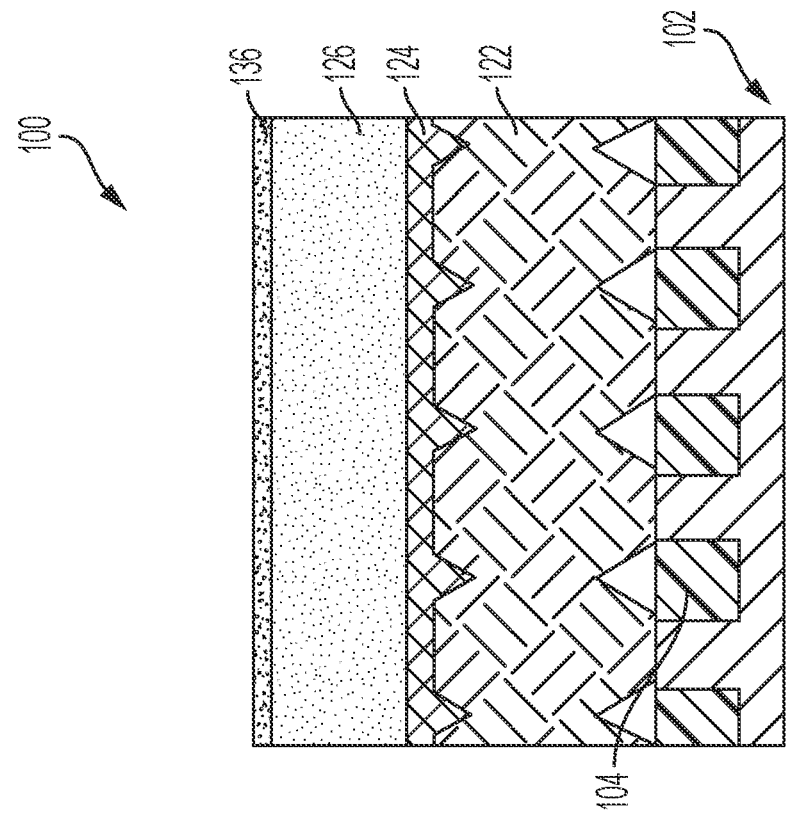
FIG. 9A is a cross-sectional view of the semiconductor device depicted in the first orientation following deposition of a metal layer on the silicide precursor material according to non-limiting embodiments of the present invention.
Figure 9B:
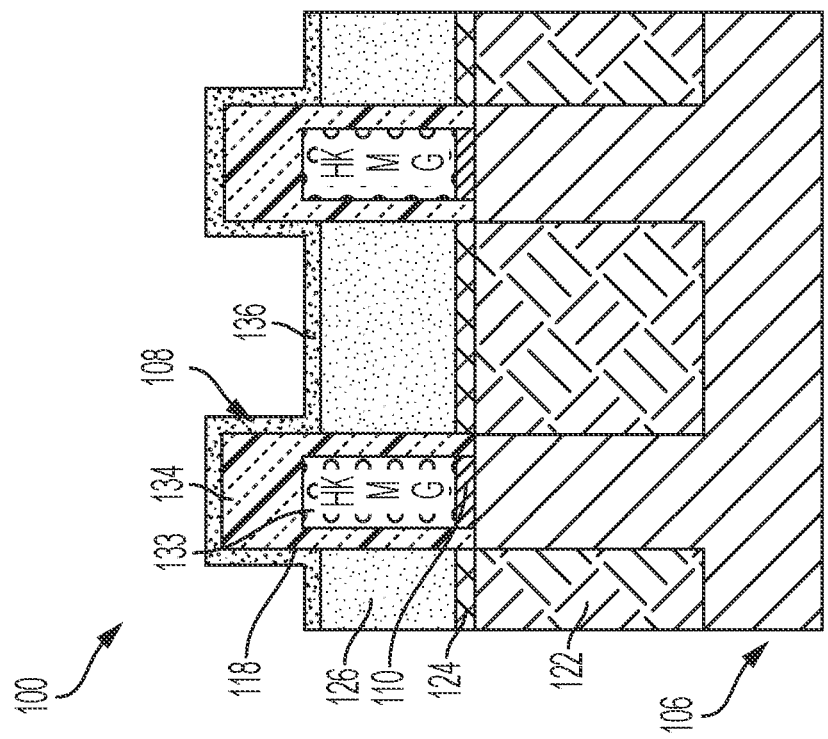
FIG. 9B is a cross-sectional view of the semiconductor device shown in FIG. 9A depicted in the second orientation.

Turning to FIGS. 9A and 9B, the semiconductor device 100 is illustrated following deposition of a low-resistive, high-diffusivity metal layer 136 on the silicide precursor material 126 and on the gate structures 108 according to non-limiting embodiments of the present invention. The metal layer 136 includes a metal such as, for example, cobalt, (Co), nickel (Ni), copper (Cu), platinum (Pt) or gold (Au), having a high-diffusion coefficient in the underlying silicide precursor material 126, e.g., a silicon material such as poly-si or a-si.

Referring now to FIGS. 10A and 10B, the semiconductor device 100 is illustrated after performing a temperature anneal. The temperature anneal induces a chemical reaction between the metal layer 136 and the underlying silicide precursor material 126. Accordingly, the metal layer 136, the underlying silicide precursor material 126, and the source/drain cap 124 are converted into a silicide 138. In this non-limiting embodiment, the silicide 138 serves as trench silicide (TS) structures for forming a wrap-around source/drain contact structure as described in greater detail below.

The source/drain cap 124 disposed on the upper surface of the active source/drains 122 slows down the silicide reaction and causes the silicide to self-limit at the cap interface. In this manner, the silicide 138 can be formed directly on the active source/drains 122 while the source/drain cap 124 protects the underlying active source/drains 122 are during the silicide formation process. In one or more non-limiting embodiments of the invention, a portion of the silicide 138 can be etched (e.g., using a RIE) selective to the gate cap 134 to recess the upper surface of the silicide 138 below the upper surface of the gate caps 134.

As described herein, the semiconductor device 100 can be fabricated as a CMOS device that includes both an n-type transistor (e.g., an nFET) and a p-type transistor (e.g., a pFET). In some embodiments of the invention, the composition of the silicide 136 used to form the nFET is the same as the composition of the silicide 136 used to form the pFET. In other embodiments of the invention, the composition of the silicide 136 used to form the nFET is different than the composition of the silicide 136 used to form the pFET. When forming a CMOS device with different silicide compositions, a first type of silicide can be formed on the nFET while the pFET is masked. When the nFET silicide formation is completed, a second mask can be applied to cover the nFET, the first mask can be removed from the pFET, and a second type of silicide can be formed on the pFET. When the pFET silicide formation is completed, the second mask can then be removed from the nFET to provide a CMOS device that employs an nFET including a first type of silicide and a pFET including a second type of silicide.

Turning to FIGS. 11A and 11B, the semiconductor device 100 is after patterning an interlayer dielectric (ILD) material 140 deposited on an upper surface of the silicide 138 (i.e., the upper surface of the TS structures). The patterning forms ILD elements on the upper surface of the gate caps 134 and defines contact trenches 142, at which corresponding metal contacts will be subsequently formed as described in greater detail below.

Figure 12A:
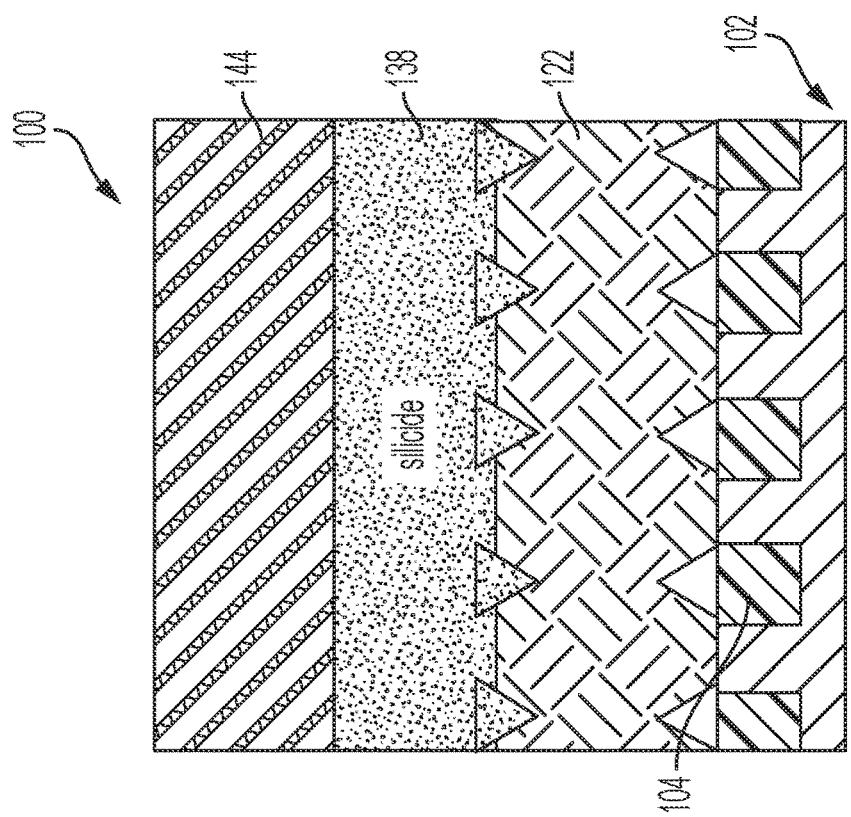
FIG. 12A is a cross-sectional view of the semiconductor device depicted in the first orientation after depositing a metal material in the contact trenches to form wrap-around metal contacts according to non-limiting embodiments of the present invention.
Figure 12B:
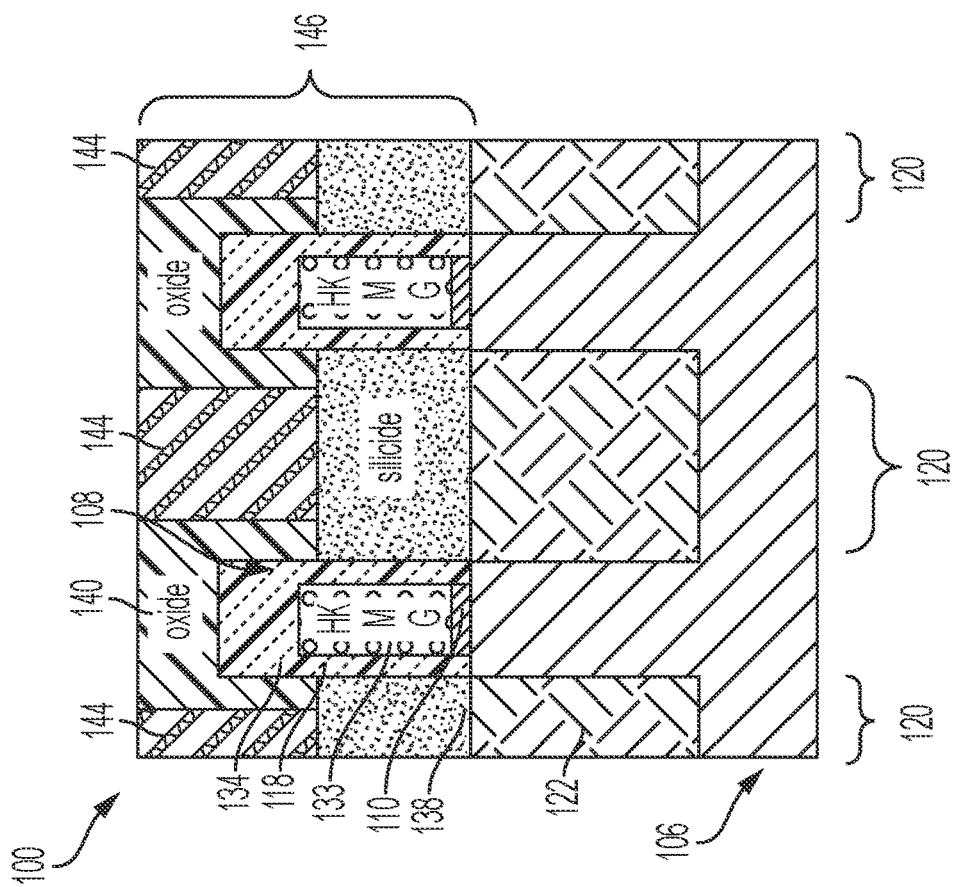

Turning to FIGS. 12A and 12B, the semiconductor device 100 is depicted after depositing a metal material 144 in the contact trenches 142 to form corresponding metal contacts. The metal material 144 can include, but is not limited to, copper (Cu), ruthenium (Ru), cobalt (Co) and tungsten (W), and can be deposited using PVD. In one or more non-limiting embodiments of the invention, the metal material 144 can be recessed (e.g., by CMP) so that an upper surface of the metal material 144 is co-planar with the upper surface of the ILD material 140. Accordingly, the metal material 144 remaining in the contact trenches define wrap-around metal contacts that wrap-around the active source/drains 122. As shown in FIG. 12A, the silicide is effectively contained entirely in the source/drain regions 120 of the semiconductor device 100. Therefore, the combination of the silicide 138 and each wrap-around metal contact 144 can be referred to as a wrap-around source/drain contact structure 146.

With reference now to FIGS. 13A-15B, a series of views illustrates a method of fabricating a semiconductor device 200 according to another non-limiting embodiment of the present invention. In this non-limiting embodiment of the invention, a silicide precursor material 126 is used to form a trench silicide (TS) structure of a stacked source/drain contact structure (CA) 206, while the silicide precursor material 126 also serves as a buffer layer that protects the underlying active source/drains 122 when converting the silicide precursor material 126 into silicide 138.

Figures 13A, 13B:
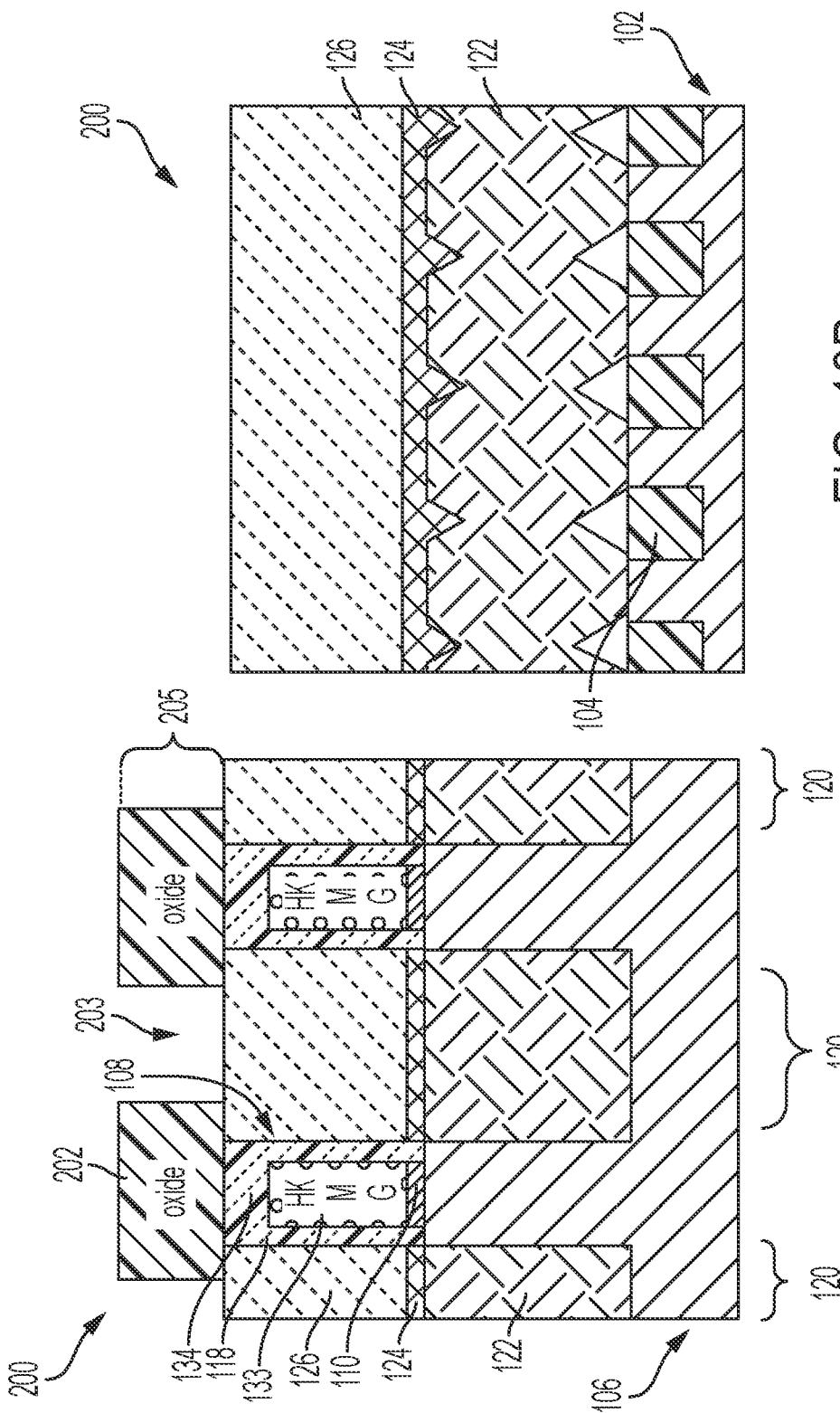

Turning to FIGS. 13A and 13B, an intermediate semiconductor device 200 is illustrated following various intermediate processing operations of a fabrication process flow. At this stage of the process flow, the semiconductor device 200 is depicted after depositing a silicide precursor material 126 on a source/drain cap layer 124 as described above with respect to FIGS. 8A and 8B. The silicide precursor material 126 is used as a buffer layer to protect the underlying active source/drains 122 when converting the silicide precursor material 126 into silicide.

As further illustrated in FIGS. 13A and 13B, an ILD material is deposited on an upper surface of the silicide precursor material 126 and is patterned to form ILD elements 202 on an upper surface of the gate caps 134. The ILD structures 202 can formed by depositing a layer of ILD on the upper surface of the silicide precursor material 126, and patterning the layer of ILD to expose portions of the silicide precursor material 126 located in the source/drain regions 122. As further illustrated in FIG. 13, patterning the ILD material defines source drain contact (CA) trenches 203 in a CA contact region 205 of the semiconductor device 200.

Referring now to FIGS. 14A and 14B, the semiconductor device 200 is illustrated following the deposition of additional silicide precursor material 126 according to a non-limiting embodiment of the invention. According to a non-limiting embodiment of the invention, the added silicide precursor material 126 is deposited so that it entirely covers the ILD structures 202. An etching process such as a CMP, for example, can be subsequently performed to recess the silicide precursor-material 126 until the upper surface of the precursor material 126 is substantially co-planar (i.e., flush) with the upper surface of the ILD structures 202.

Figure 15B:
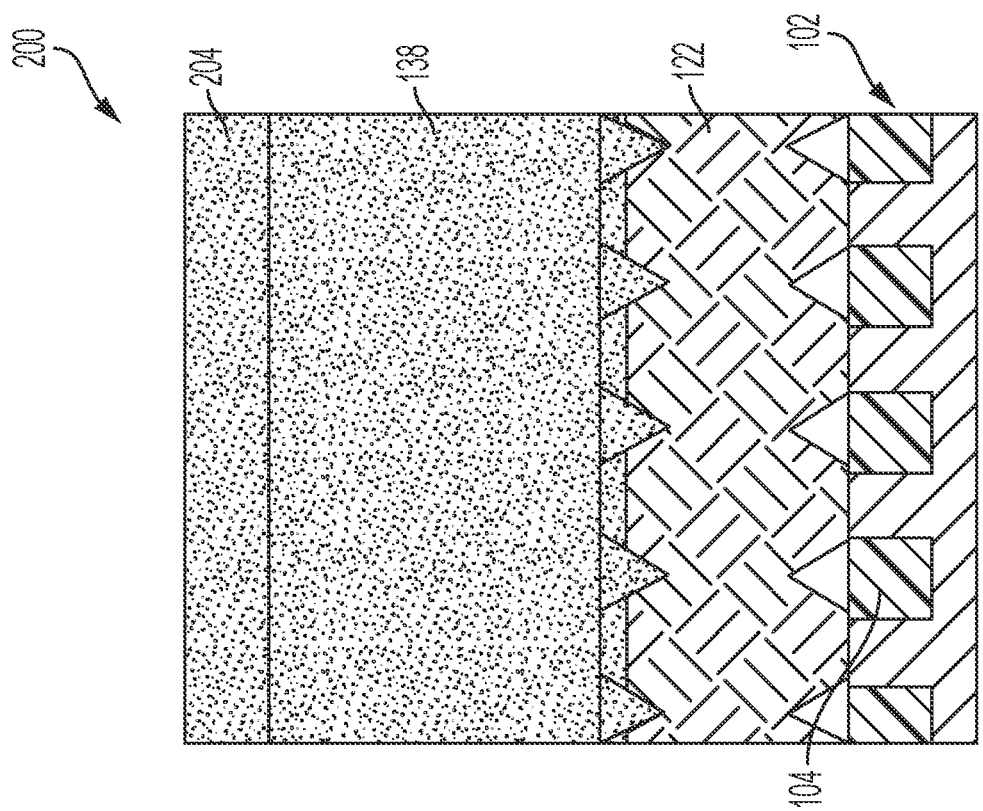
Figure 15A:
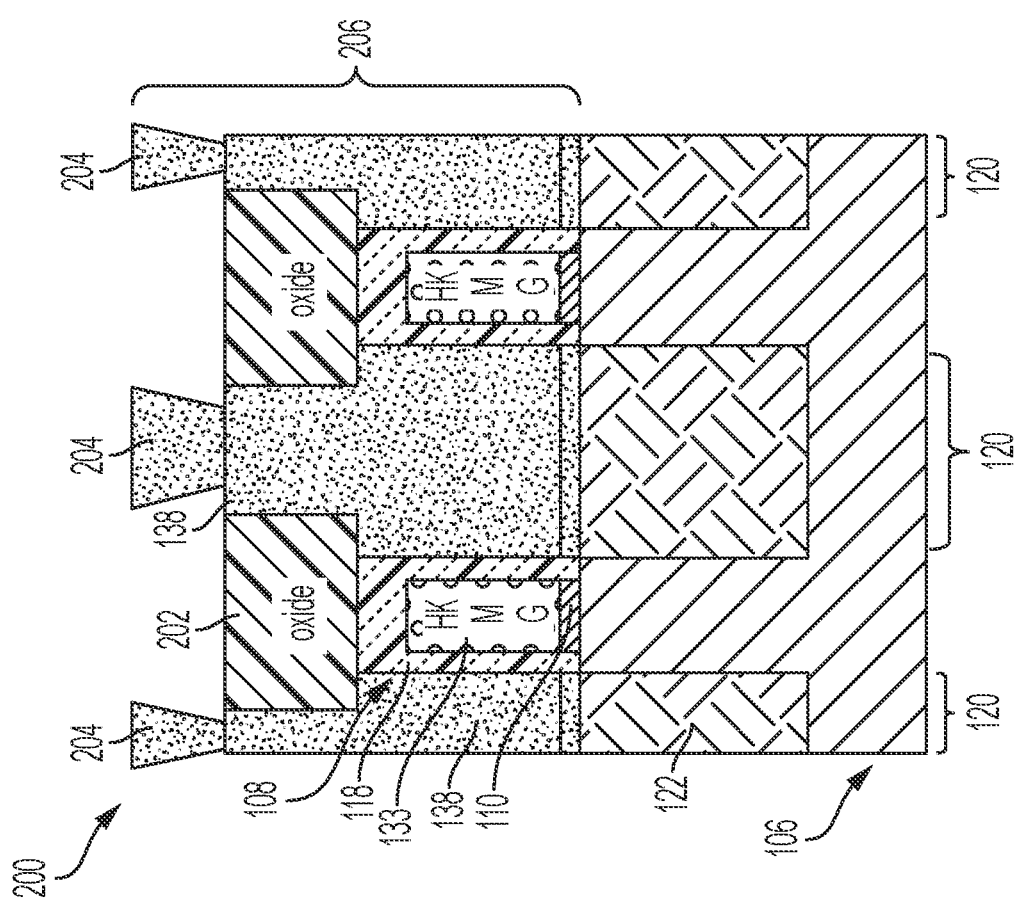
FIG. 15A is a cross-sectional view of the semiconductor device depicted in the first orientation after converting the silicide precursor material into silicide and forming metal contacts on the silicide according to non-limiting embodiments of the present invention.

Turning to FIGS. 15A and 15B, the semiconductor device 200 is illustrated after converting the silicide precursor-material 126 into silicide 138. As described herein, the silicide 138 can be formed by performing a temperature anneal, which induces a chemical reaction between a low-resistive, high-diffusivity metal layer 136 (not shown in FIGS. 13A-15B) deposited on an upper surface of the silicide precursor material 126. Accordingly, the metal layer 136, the underlying silicide precursor material 126, and the source/drain cap 124 are converted into silicide 138. The source/drain cap layer 124 further protects the underlying active source/drains 122 by inhibiting silicide formation at the cap interface, thereby effectively causing the silicide 138 to self-limit at the source/drain cap layer 124.

As described herein, the semiconductor device 200 according to some embodiments of the invention utilizes silicide 136 having the same composition (i.e., the same type of silicide) when forming both the nFET and the pFET. In other embodiments of the invention, the composition of the silicide 136 used to form the nFET is different than the composition of the silicide 136 used to form the pFET.

Still referring to FIGS. 15A and 15B, metal CA contacts 204 are formed on the upper surface of the silicide 138 contained in a respective source/drain region 120 to define the stacked source/drain contact structure (CA) 206. As shown in FIGS. 15A and 15B, the silicide 138 completely fills the trench silicide level and the CA level of the CA structure 206 located beneath the CA contacts 204. The metal contacts 204 can be formed from various types of metal including, but not limited to, copper (Cu) and tungsten (W). The silicide 138 located in a respective source/drain region 120 defines a TS structure of a corresponding stacked source/drain contact structure (CA). The TS structures 138 serve as a shunt that is capable of creating a low electrical resistance path) between a respective metal CA contact 204 and active source/drain region 122.

With reference now to FIGS. 16A-18B, a series of views illustrates a method of fabricating a semiconductor device 300 according to another non-limiting embodiment of the present invention. In this non-limiting embodiment of the invention, a silicide precursor material 126 is used to encapsulate a TS region 302, a CA region 304, and an inter-layer metal (Mx) region 306, while the silicide precursor material 126 also serves as a buffer layer that protects the underlying active source/drains 122 when converting the silicide precursor material 126 into silicide 138.

Turning to FIGS. 16A and 16B, an intermediate semiconductor device 300 is illustrated following various intermediate processing operations of a fabrication process flow. At this stage of the process flow, the semiconductor device 300 is depicted after depositing a silicide precursor material 126 on a source/drain cap layer 124 as described above with respect to FIGS. 14A and 14B. In one or more non-limiting embodiments, the silicide precursor material 126 deposited in the TS region 302 and the CA region 304 to completely encapsulate the ILD structures 202. In one or more non-limiting embodiments of the invention, the silicide precursor material 126 is recessed until the upper surface of the silicide precursor material 126 is substantially co-planar (i.e., flush) with the upper surface of the ILD structures 202.

Referring to FIGS. 17A and 17B, the semiconductor device 300 is illustrated after forming a via structure 308 in a Mx region 306. The via structures 308 can be formed by depositing an oxide layer on the CA region 304, and subsequently patterning the oxide (e.g., using lithography an RIE procedures) to define the via structures 308.

As further shown in FIGS. 17A and 17B, additional silicide precursor material 126 is subsequently deposited on top the CA region 304 to cover the via structure 308. In one or more non-limiting embodiments of the invention, the added silicide precursor material 126 is recessed until the upper surface of the silicide precursor material 126 is substantially co-planar (i.e., flush) with the upper surface of the via structures 308. Accordingly, the silicide precursor material 126 encapsulates the CA region 302, the TS region 304 and the Mx region 306.

Turning now to FIGS. 18A and 18B, the semiconductor device 300 is illustrated after converting the silicide precursor material 126 into silicide 138. As described herein, the silicide 138 can be formed by performing an anneal process, which induces a chemical reaction between a low-resistive, high-diffusivity metal layer 136 (not shown in FIGS. 16A-18B) deposited on an upper surface of the silicide precursor material 126. Accordingly, the metal layer 136, the underlying silicide precursor material 126, and the source/drain cap 124 are converted into silicide 138. The source/drain cap layer 124 further protects the underlying active source/drains 122 by inhibiting silicide formation at the cap interface, thereby effectively causing the silicide 138 to self-limit at the source/drain cap layer 124.

As described herein, the semiconductor device 300 according to some embodiments of the invention utilizes silicide 136 having the same composition (i.e., the same type of silicide) when forming both the nFET and the pFET. In other embodiments of the invention, the composition of the silicide 136 used to form the nFET is different than the composition of the silicide 136 used to form the pFET.

With continued references to FIGS. 18A-18B, the silicide 138 can be recessed so that the upper surface of the silicide 138 is substantially co-planar (i.e., flush) with the upper surface of the via structures 308. Accordingly, the silicide 138 is contained entirely in the CA region 302, the TS region 304, and the Mx region 306. In this manner, the silicide 138 can serve as a shunt, which reduces electrical resistance in the CA region 302, the TS region 304, and the Mx region 306.

Referring now to FIGS. 19A-20B, a series of views illustrates a method of fabricating a semiconductor device 400 according to another non-limiting embodiment of the present invention. In this non-limiting embodiment of the invention, a silicide precursor material 126 is used to encapsulate a middle of line (MOL) region 402, while the silicide precursor material 126 also serves as a buffer layer that protects the underlying active source/drains 122 when converting the silicide precursor material 126 into silicide 138.

Turning to FIGS. 19A and 19B, an intermediate semiconductor device 400 is illustrated following various intermediate processing operations of a fabrication process flow. At this stage of the process flow, the semiconductor device 400 is depicted after depositing a silicide precursor material 126 on a source/drain cap layer 124 as described above with respect to FIGS. 8A and 8B. In one or more non-limiting embodiments of the invention, the silicide precursor material 126 is deposited to completely cover and encapsulate the gate structures 108, and is then subsequently recessed (e.g., using a CMP process) so that the upper surface of the upper surface of the silicide precursor material 126 is substantially co-planar (i.e. flush) with the upper surface of the gate caps 134. As described herein, the silicide precursor material 126 can be used as a buffer layer to protect the underlying active source/drains 122 when converting the silicide precursor material 126 into silicide 138 as described herein.

Turning to FIGS. 20A and 20B, the semiconductor device 400 is illustrated after converting the silicide precursor material 126 into silicide 138. The silicide 138 can be formed by performing a temperature anneal, which induces a chemical reaction between a low-resistive, high-diffusivity metal layer 136 (not shown in FIGS. 19A-20B) deposited on an upper surface of the silicide precursor material 126. Accordingly, the metal layer 136, the underlying silicide precursor material 126, and the source/drain cap 124 are converted into silicide 138. The source/drain cap layer 124 further protects the underlying active source/drains 122 by inhibiting silicide formation at the cap interface, thereby effectively causing the silicide 138 to self-limit at the source/drain cap layer 124. Accordingly, the MOL region 402 is filled entirely with silicide 138, which can serve as a shunt to reduces the electrical resistance in the MOL region 402.

In one or more non-limiting embodiments of the invention, the MOL region 402 can be utilized to establish electrical connections to a separate transistor and/or interconnect components 404 using a one or more MOL contact structures 406 such as, for example, solder balls. Accordingly, the silicide 138 can serve as a shunt that reduces the electrical resistance in the MOL region 402

As described herein, the semiconductor device 400 according to some embodiments of the invention utilizes silicide 136 having the same composition (i.e., the same type of silicide) when forming both the nFET and the pFET. In other embodiments of the invention, the composition of the silicide 136 used to form the nFET is different than the composition of the silicide 136 used to form the pFET.

The various non-limiting embodiments of the present invention described in detail above provide a 3D transistor that includes liner-free resistance contacts in combination with silicide that reduces electrical resistance in the source/drain regions. The 3D transistor employs a silicide precursor material that is used to subsequently form the silicide serves as a diffusion buffer layer during the silicidation (i.e., formation of the silicide). A source/drain cap further protects the active source/drains by slowing down the silicide formation at the cap interface and effectively causing the silicide to self-limit at the cap interface. The converted silicide is capable inhibiting electron diffusion from a large amount of low-resistive, high-diffusion metals that can serve as source/drain contacts, while also serving as a shunt (i.e., creating a low electrical resistance path) between the source/drain contacts and the active source/drains.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
   forming an active source or drain (source/drain) in respective designated source/drain regions of the semiconductor device;
   depositing a source/drain cap liner on an upper surface of the active source/drains;
   depositing a silicide precursor material on an upper surface of the source/drain cap liner;
   recessing a portion of the silicide precursor material to expose an upper portion of a gate structure;
   converting the silicide precursor material into a silicide material,
   depositing an interlayer dielectric (ILD) on an upper surface of the silicide material to cover the upper portion of the gate structure;
   patterning the ILD to define contact trenches; and
   depositing a metal material in the contact trenches to form wrap-around contact structures, each wrap-around contact structure including the metal material directly on an upper surface of the silicide material and the silicide material directly on the active source/drain.

2. The method of claim 1, wherein converting the silicide precursor material further comprises:
   depositing a metal layer on an upper surface of the silicide precursor material; and
   applying a thermal anneal to the semiconductor device to convert the metal layer and the silicide precursor material into the silicide material.

3. The method of claim 2, wherein the silicide precursor material comprises polysilicon or amorphous silicon.

4. The method of claim 3, wherein the silicide material is contained completely in the designated source/drain regions and surrounds a gate structure of the semiconductor device.

5. The method of claim 1 further comprising:
   depositing an interlayer dielectric (ILD) on an upper surface of the silicide precursor material;
   patterning the ILD to define a source/drain contact trenches of a source/drain contact region;
   depositing a second silicide precursor material in the source/drain contact trenches; and
   converting the silicide precursor material and the second silicide precursor material into the silicide material.

6. The method of claim 5, wherein the silicide material completely fills the source/drain contact region and is formed directly on the active source/drains.

7. The method of claim 6 further comprising forming at least one metal source/drain contact on an upper surface of the silicide material.

8. The method of claim 1, wherein patterning the ILD further comprises:
   depositing an interlayer dielectric (ILD) on an upper surface of the silicide precursor material;
   patterning the ILD to define ILD elements on an upper surface of the gate structure;
   depositing a second silicide precursor material on the ILD elements to define a source/drain contact region;
   forming on an upper surface of the ILD elements a via structure of an inter-layer metal region;
   depositing a third silicide precursor material on the second silicide precursor material to completely fill the inter-layer metal region and cover the via structure; and
   converting the silicide precursor material, the second silicide precursor material, and the third silicide precursor material into the silicide material.

9. The method of claim 8 wherein the silicide material completely fills the inter-layer metal region.

10. The method of claim 1 further comprising:
    forming a gate structure of the semiconductor device;
    depositing the silicide precursor material to cover the gate structure and define a middle of the line (MOL) region;
    converting the silicide precursor material into the silicide material; and
    recessing the silicide material so that an upper surface of the silicide material is co-planar with an upper surface of the gate structure and the silicide material completely fills the MOL region.

11. The method of claim 10, wherein the silicide precursor material comprises polysilicon or amorphous silicon.

12. The method of claim 11 further comprising forming at least one MOL contact structure on the upper surface of the silicide material that fills the MOL region.

* * * * *